United States Patent
Liang et al.

(10) Patent No.: US 8,385,464 B2
(45) Date of Patent: Feb. 26, 2013

(54) METHODS AND APPARATUS FOR REDUCING AVERAGE-TO-MINIMUM POWER RATIO IN COMMUNICATIONS SIGNALS

(75) Inventors: Paul Cheng-Po Liang, Santa Clara, CA (US); Hua Wang, San Mateo, CA (US); Kenichi Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 825 days.

(21) Appl. No.: 12/482,913

(22) Filed: Jun. 11, 2009

(65) Prior Publication Data

US 2010/0316164 A1 Dec. 16, 2010

(51) Int. Cl.
*H04K 1/02* (2006.01)
*H04L 25/03* (2006.01)
*H04L 25/49* (2006.01)

(52) U.S. Cl. ........................................ 375/296; 375/295
(58) Field of Classification Search ................... 375/296
See application file for complete search history.

(56) References Cited

U.S. PATENT DOCUMENTS

| 7,054,385 | B2 | 5/2006 | Booth et al. |
| 2004/0218689 | A1* | 11/2004 | Akhtman ........................ 375/296 |
| 2005/0163248 | A1* | 7/2005 | Berangi et al. ................ 375/296 |
| 2005/0281360 | A1* | 12/2005 | Booth et al. ................... 375/346 |
| 2006/0215732 | A1* | 9/2006 | Chen et al. .................... 375/141 |

* cited by examiner

*Primary Examiner* — Erin File

(57) ABSTRACT

A baseband circuit for a communications transmitter includes a baseband modulator, a pulse-shaping filter, and an AMPR reduction circuit. The baseband modulator is configured to generate a sequence of symbols formatted in accordance with a non-constant envelope modulation scheme. The pulse-shaping filter is configured to band-limit the sequence of samples to provide a sequence of samples. The AMPR reduction circuit is configured to analyze and modify one or more samples in the sequence of samples, if a sample in the sequence of samples that has been previously analyzed by the AMPR reduction circuit is determined to have a magnitude less than a predetermined low-magnitude threshold.

23 Claims, 19 Drawing Sheets

200

|  | AMPR [dB] | ACLR5 [dBc] | ACLR10 [dBc] | RxN45 [dBm/100kHz] | EVM [%] |
|---|---|---|---|---|---|
| 3GPP Spec | N/A | -33 | -43 | Not to desensitize receiver | 17.5 |
|  |  |  |  |  |  |
| Method 1 | 10 | -48.45 | -60.87 | -94.08 | 5.04 |
| Method 2 | 10 | -49.44 | -61.46 | -94.16 | 3.67 |
| Method 3 | 10 | -49.40 | -61.64 | -94.11 | 3.74 |

FIGURE 16

|  | AMPR [dB] | ACLR5 [dBc] | ACLR10 [dBc] | RxN45 [dBm/100kHz] | EVM [%] |
|---|---|---|---|---|---|
| 3GPP Spec | N/A | -33 | -43 | Not to desensitize receiver based on certain operation condition | 17.5 |
| Method 1 | 18 | -47.56 | -58.13 | -91.02 | 5.12 |
| Method 2 | 16.5 | -47.38 | -59.37 | -91.73 | 5.46 |
| Method 3 | 16.5 | -47.34 | -59.53 | -92.49 | 5.47 |

FIGURE 17

|          | AMPR [dB] | ACLR5 [dBc] | ACLR10 [dBc] | RxN45 [dBm/100kHz] | EVM [%] |
|---|---|---|---|---|---|
| 3GPP Spec | N/A | -33 | -43 | Not to desensitize receiver based on certain operation condition | 17.5 |
| Method 1 | 18 | 47.53 | -55.26 | -80.49 | 5.78 |
| Method 2 | 17 | -47.88 | -55.86 | -83.02 | 5.36 |
| Method 3 | 17 | -47.63 | -55.88 | -83.38 | 5.53 |

FIGURE 18 ized to limit their bandwidth. To limit their bandwidth, the baseband processor 102

METHODS AND APPARATUS FOR REDUCING AVERAGE-TO-MINIMUM POWER RATIO IN COMMUNICATIONS SIGNALS

FIELD OF THE INVENTION

The present invention relates to communications systems and methods. More specifically, the present invention relates to methods and apparatus for reducing the average-to-minimum power ratio (AMPR) in communications signals.

BACKGROUND OF THE INVENTION

Radio frequency (RF) communications is used in a wide variety of modern-day communications applications, including military, satellite, public health and safety, television, cellular, and wireless area network communications applications. A key component of any RF communications system is the RF transmitter. As illustrated in FIG. 1, an RF transmitter 100 generally comprises a baseband processor 102, a frequency upconverter 104, a power amplifier (PA) 106 and an antenna 108. The purpose of the baseband processor 102 is to generate a baseband signal s(t) that contains a message to be transmitted and which is formatted in accordance with a predetermined modulation scheme. The purpose of the frequency upconverter 104 is to upconvert the baseband signal s(t) to RF, so that the message can be transmitted through space (i.e., over the air) to a remote receiver. The PA 106 is used to increase the power of the RF signal before it is radiated by the antenna 108, to compensate for attenuation of the RF signal as it propagates over the air to the remote receiver.

In modern RF transmitters, the message to be transmitted is first digitized in the form of a binary-source data stream. The baseband processor 102 then groups data bits in the binary-source data stream into a sequence of N-bit words, where N is some positive integer, and maps the pattern of bits in each N-bit word to one of $M=2^N$ possible symbols. The M symbols are defined by the particular modulation scheme being employed, and affect how the amplitude and/or angle of the RF carrier signal is varied (i.e., modulated) to carry the message in the original binary-source data stream to the remote receiver. By mapping each N-bit word to one of M possible symbols, $N=\log_2 M$ bits can be transmitted in each symbol.

Conceptually, the symbols generated by the baseband processor 102 can be visualized as a sequence of weighted impulses. These impulses have essentially infinite bandwidth. To limit their bandwidth, the baseband processor 102 is further configured to shape each symbol by a band-limiting pulse p(t) to form the desired baseband signal s(t).

Mathematically, the baseband signal s(t) can be expressed as a sequence of pulse-shaped symbols:

$$s(t) = \sum_n a_n p(t - nT_s),$$

where n is a symbol index, $a_n$ is the $n^{th}$ symbol in the sequence of symbols, p(t) is the pulse at time t, and $T_s$ is the symbol period. $a_n$ is either a real or complex number having one of M possible states. For example, in the quadrature phase-shift keying (QPSK) modulation scheme, M=4, and $a_n$ is given by $a_n = e^{j\pi(2d_n+1)/2}$, where $d_n$ is an integer selected from the set {0, 1, 2, 3}.

Because the baseband signal s(t) is in general a complex signal it is usually expressed in terms of its in-phase (I) and quadrature (Q) components, i.e., as s(t)=I(t)+jQ(t), and the baseband processor 102 is configured to generate separate pulse-shaped I and Q baseband signals for each of the I and Q channels of the RF transmitter.

FIG. 2 is a drawing showing how the baseband signal s(t) is processed in terms of its I and Q components in a practical RF transmitter 200. The RF transmitter 200 comprises a baseband processor 202, I-channel and Q-channel digital to analog converters 204 and 206, a transmit local oscillator (Tx-LO) 208, a quadrature modulator 210; a PA 212; and an antenna 214. Because of its use of the quadrature modulator 210, the RF transmitter 200 is referred to in the description that follows as the "quadrature-modulator-based" transmitter 200.

As shown in FIG. 2, the quadrature modulator 210 includes an I-channel mixer 216, a Q-channel mixer 218, a ninety-degree phase shifter 220, and a subtractor 222. The I-channel and Q-channel digital to analog converters 204 and 206 convert the pulse-shaped I and Q baseband signals from the baseband processor 202 into analog I and Q baseband signals. The quadrature modulator 210 then upconverts the analog I and Q baseband signals to RF. Specifically, the I-channel mixer 216 mixes the analog I baseband signal with an RF carrier signal provided by the Tx-LO 208, while the Q-channel mixer 218 mixes the analog Q baseband signal with a ninety-degree phase shifted version of the RF carrier signal produced at the output of the ninety-degree phase shifter 220. The upconverted I- and Q-channel RF carrier signals are then combined by the subtractor 222, to produce the desired modulated RF carrier signal. Finally, the modulated RF carrier signal is amplified by the PA 212 and radiated over the air to a remote receiver by the antenna 214.

One advantage of the quadrature-modulator-based RF transmitter 200 is that both amplitude and angle (i.e., frequency or phase) modulation can be introduced into the RF carrier signal by simply controlling the amplitudes of the I and Q baseband signals. However, for reasons discussed below, a significant drawback of the quadrature-modulator-based transmitter 200 is that it is not very energy efficient, particularly when the modulation scheme being employed is a non-constant envelope modulation scheme.

In an effort to use the RF spectrum as efficiently as possible, many modern communications systems employ non-constant envelope modulation schemes, i.e., modulation schemes in which both the amplitude and angle of the baseband signal s(t) are varied. As illustrated in FIG. 3, use of a non-constant envelope modulation scheme results in a modulated RF carrier signal at the RF input RFin of the PA 212 that has a non-constant (i.e., time varying) envelope. To prevent the PA 212 from clipping the signal peaks of these signals, the input power of the modulated RF carrier signal must be backed off to ensure that the PA 212 always operates in its linear region of operation. In other words, the PA 212 must be operated as a "linear" PA when a quadrature modulator is used.

While employing power back-off does help to ensure PA linearity, it results in a significant reduction in energy efficiency. The energy efficiency of an RF transmitter is determined in large part by how efficient the RF transmitter's PA is. The energy efficiency of a PA is defined as the ratio of the PA RF output power to the direct current (DC) power supplied to the PA 212 from the RF transmitter's constant voltage supply Vs. Energy efficiency is therefore high when the PA is operating at high RF output powers, but low when the PA is operating at low RF output powers. In most applications, the PA operates at high or peak RF output powers only for very short periods of time. For all other times, the RF output power is backed off. This is the primary reason power back-off results in a substantial reduction in energy efficiency. Low energy efficiency is undesirable in most any application. It is particularly undesirable in battery-powered RF transmitters, such as those used in cellular handsets, since it results in reduced battery life.

Fortunately, an alternative type of communications transmitter known as a polar transmitter is available which avoids the linearity v. efficiency tradeoff of the quadrature-modulator-based transmitter 200. In a polar transmitter the amplitude information (i.e., the signal envelope) is temporarily removed from the non-constant envelope signal. As explained in more detail below, the removed signal envelope is used to control the power of the PA, while the remaining signal, which has a constant amplitude, is applied to the RF input port of the PA. Because the signal applied to the RF input of the PA has a constant envelope, a more efficient nonlinear PA can be used without the risk of signal peak clipping.

FIG. 4 is a drawing showing the basic elements of a typical polar transmitter 400. The polar transmitter 400 comprises a baseband processor 402; a Coordinate Rotation Digital Computer (CORDIC) converter (i.e., rectangular-to-polar converter) 404; an amplitude path including an amplitude path DAC 406 and amplitude modulator 408; an angle path including an angle path DAC 410 and angle modulator 412; a PA 414; and an antenna 416. The purpose of the CORDIC converter 404 is to convert the digital rectangular-coordinate pulse-shaped I and Q baseband signals from the baseband processor 402 to digital polar-coordinate amplitude and angle component signals $\rho$ and $\theta$. The amplitude and angle path DACs 406 and 410 convert the digital amplitude and angle component signals $\rho$ and $\theta$ into analog amplitude and angle modulation signals. In the amplitude path, the amplitude modulator 408 then modulates a direct current power supply voltage Vsupply (e.g., as provided by a battery) by the amplitude information in the analog amplitude modulation signal. The resulting amplitude-modulated power supply signal Vs(t) is coupled to the power supply port of the PA 414. Meanwhile, in the angle path the angle modulator 412 operates to modulate an RF carrier signal by the angle information in the analog angle modulation signal, to produce an angle-modulated RF carrier signal which is coupled to the RF input port RFin of the PA 414.

As shown in FIG. 5, the angle-modulated RF carrier signal at the RF input port RFin of the PA 414 has a constant envelope. As alluded to above, this permits the PA 414 to be configured to operate in its nonlinear region of operation (i.e., as a "nonlinear" PA) without the risk of signal peak clipping. Typically the PA 414 is implemented as a highly-efficient switch-mode PA (e.g., as a Class D, E or F switch-mode PA) operating between compressed and cut-off states. When configured in this manner the envelope information in the amplitude-modulated power supply signal Vs(t) is restored at the RF output RFout of the PA 414 as the PA 414 amplifies the angle-modulated RF carrier signal. It is because the PA 414 is operated as a switch and the power supplied to the PA 414 is dynamically controlled that the polar transmitter 400 is significantly more energy efficient than the more conventional quadrature-modulator-based RF transmitter 200.

Although the polar transmitter 400 is capable of transmitting non-constant envelope signals at a higher energy efficiency than the conventional quadrature-modulator-based transmitter 200, the amplitude and angle component signals $\rho$ and $\theta$ typically have much higher signal bandwidths than the rectangular-coordinate I and Q baseband signals from which they derive. This so-called "bandwidth expansion" phenomenon occurs during the rectangular-to-polar conversion process performed by the CORDIC converter 404. The high signal bandwidths are manifested as high-frequency events in the amplitude and angle component signals $\rho$ and $\theta$ and are highly undesirable. Not only do the high-frequency events tend to degrade the modulation accuracy of the polar transmitter 400, they also cause the transmission spectrum to extend beyond its intended band-limited channel, resulting in adjacent channel interferers and an increase in receive band noise (RxN). These effects can be very difficult to deal with, especially when modulation accuracy and noise limitation standards must be adhered to.

The extent to which high-frequency events appear in the amplitude and angle component signals $\rho$ and $\theta$ is very much dependent on the modulation scheme that is employed. Modulation schemes that produce signals having a high average-to-minimum power ratio (AMPR) generally have a very large angle component bandwidth. In fact, for modulation schemes that produce signal magnitudes that pass through zero, as illustrated in the signal trajectory diagram in FIG. 6, the signal phase changes very abruptly, by as much as 180 degrees, resulting in an angle component signal $\theta$ having essentially infinite bandwidth. Signals of such high bandwidth cannot be accurately processed and transmitted by the polar transmitter 400, or by any type of transmitter for that matter.

Various techniques have been proposed to reduce high-frequency events in polar domain signals. One approach, known as "hole blowing," involves identifying symbols (or samples of symbols) in the baseband signal s(t) during which the magnitude of the signal falls below a predetermined low-magnitude threshold $\alpha$, and then raising the magnitude of the baseband signal s(t) in the temporal vicinity of the identified symbols or samples so that the AMPR of the signal is reduced. The term "hole blowing" is used since the effect of applying the technique is to produce a "hole" in the signal trajectory diagram of the baseband signal s(t). As illustrated in FIG. 7, the "hole" forces the signal trajectory of the modified baseband signal $\hat{s}(t)$ to not pass too close to the origin, resulting in a desired reduction in the bandwidth of the signal.

The conventional hole blowing technique is described in detail in U.S. Pat. No. 7,054,385. As explained there, the baseband signal s(t) is modified by adding correction pulses to it, to form the modified baseband signal:

$$\hat{s}(t) = \sum_n a_n p(t - nT_s) + \sum_m b_m r(t - t_m),$$

where r(t) is the correction pulse, m is the perturbation index, $t_m$ represents the times when it is desired to perturb the baseband signal s(t) (i.e., times when the correction pulse r(t) is to be inserted), and $b_m$ is a perturbation sequence representing the amplitude scaling and/or phase shifting to be applied to the correction pulse r(t).

As shown in FIG. 8, in generating the modified baseband signal $\hat{s}(t)$ the baseband signal s(t) from the baseband processor 802 is fed forward to an analyzer 804. The analyzer 804 then determines the perturbation times $t_m$ by detecting low-magnitude events in the baseband signal s(t) that fall below the predetermined magnitude threshold $\alpha$. In response to detected low-magnitude events, the analyzer 804 generates the perturbation sequence $b_m$. A pulse-shaping filter 806 generates the correction pulse r(t), scales the pulse by the perturbation sequence $b_m$, and finally adds the scaled correction pulses to the original baseband signal s(t) to produce the desired AMPR-reduced modified baseband signal $\hat{s}(t)$.

The conventional hole blowing technique can be effective in some applications. However, it can be deficient or even detrimental in others, particularly in applications that employ modulation schemes having signal constellation points near or concentrated near the origin in the complex signal plane. Various modulation schemes, such as those used by the High-Speed Packet Access (HSPA) communication protocol in modern mobile communications systems, produce signal trajectories having low magnitudes that endure for an extended period of time, e.g., by encircling a constellation point at the origin in the complex signal plane, as illustrated in FIG. 9. When the conventional hole blowing technique is applied to such signals, the signal trajectory is altered more than is necessary and, as a consequence, the modulation accuracy of the transmitter is significantly degraded. For other types of signals, the conventional hole blowing technique is ineffective at reducing the AMPR of the signals to levels necessary to reduce out-of-band transmission energy to required or desired levels.

Another problem with the conventional hole blowing technique is that there is no way to be sure or to verify that the signal trajectory of the modified baseband signal ŝ(t) has been pushed outside the low-magnitude threshold, as intended, once the hole blowing process has been applied. In fact, once the hole blowing process has been applied there is no way of even being sure that the modified signal trajectory avoids passing through the origin.

It would be desirable, therefore, to have methods and apparatus that are effective at reducing the AMPR in communications signals but which are not plagued by the drawbacks and limitations associated with conventional hole blowing techniques.

SUMMARY OF THE INVENTION

Methods and apparatus for reducing the average-to-minimum power ratio (AMPR) in communications signals are disclosed. An exemplary AMPR-reducing apparatus includes a baseband circuit that includes a baseband modulator, a pulse-shaping filter, and an AMPR reduction circuit. The baseband modulator is configured to generate a sequence of symbols formatted in accordance with a non-constant envelope modulation scheme. The pulse-shaping filter band-limits the sequence of samples to provide a sequence of samples. The AMPR reduction circuit then analyzes and modifies one or more samples in the sequence of samples, if a sample in the sequence of samples that has been previously analyzed by the AMPR reduction circuit is determined to have a magnitude less than a predetermined low-magnitude threshold.

An exemplary method of reducing the AMPR in a communications signal includes first determining whether the magnitude of a first sample in a sequence of samples of the communications signal is less than a predetermined low-magnitude threshold. If the magnitude of the first sample is determined to be less than the low-magnitude threshold, the first sample and a second sample in the sequence of samples following the first sample are modified (by increasing their magnitudes and/or altering their phases) to reduce the AMPR of the communications signal. Next, the magnitude of the previously modified second sample is compared to the low-magnitude threshold. If the magnitude of the previously modified second sample is determined to be less than the low-magnitude threshold, the previously modified second sample is further modified by further increasing its magnitude and/or altering its phase.

The AMPR-reducing methods and apparatus of the present invention may be exploited in any type of transmitter in which a high AMPR is of concern. Examples of their use in a quadrature-modulator based transmitter and in a polar transmitter are described.

Further features and advantages of the present invention, including descriptions of the structure and operation of the above-summarized and other exemplary embodiments of the invention, will now be described in detail with respect to accompanying drawings, in which like reference numbers are used to indicate identical or functionally similar elements.

BRIEF DESCRIPTION OF THE DRAWINGS

FIG. 16 is a table summarizing simulation results of a polar transmitter, similar to the polar transmitter in FIG. 15, configured to generate a reduced-AMPR baseband signal s(t) formatted in accordance with the Hybrid Phase Shift Keying (HPSK) non-constant envelope modulation scheme used in third generation (3G) Universal Mobile Telecommunications System (UMTS) mobile communications systems;

FIG. 17 is a table summarizing simulation results of a polar transmitter, similar to the polar transmitter in FIG. 15, configured to generate a reduced-AMPR baseband signal s(t) formatted in accordance with the non-constant envelope modulation scheme used by the High-Speed Downlink Packet Access (HSDPA) communications protocol in 3G UMTS mobile communications systems;

FIG. 18 is a table summarizing simulation results of a polar transmitter, similar to the polar transmitter in FIG. 15, configured to generate a reduced-AMPR baseband signal s(t) formatted in accordance with the non-constant envelope modulation scheme used by the High-Speed Uplink Packet Access (HSUPA) communications protocol in 3G UMTS mobile communications systems;

DETAILED DESCRIPTION

Figure 1:
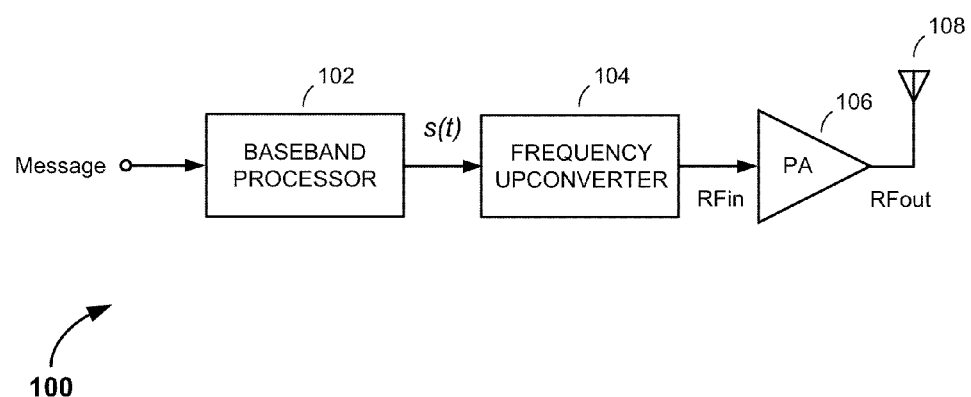
FIG. 1 is a simplified drawing of a radio frequency (RF) transmitter.
Figure 2:
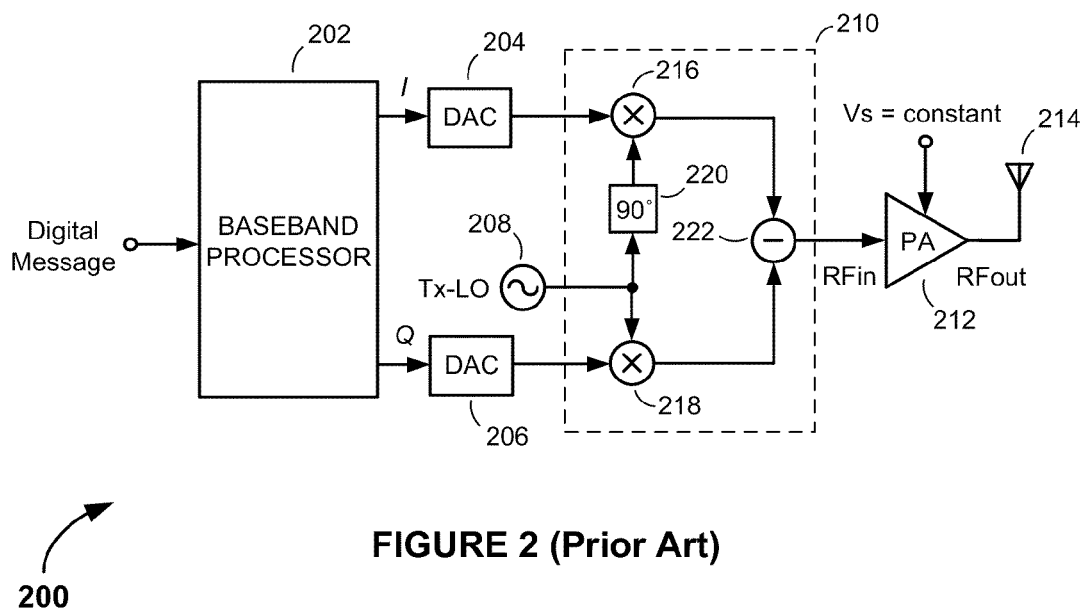
FIG. 2 is drawing of a conventional quadrature-modulator-based transmitter.
Figure 3:
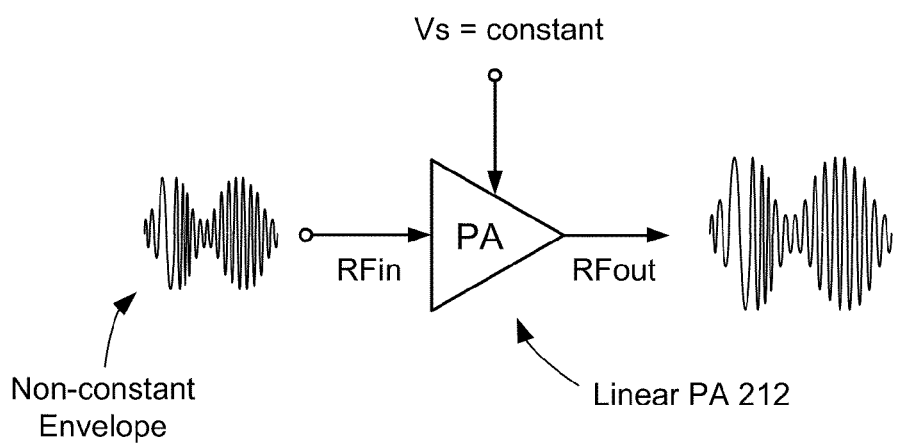
FIG. 3 is a drawing illustrating how the modulated RF carrier signal presented to the RF input port of the power amplifier (PA) of a quadrature-modulator-based transmitter has a non-constant envelope when the quadrature-modulator-based transmitter is configured to operate in accordance with a non-constant envelope modulation scheme.
Figure 4:
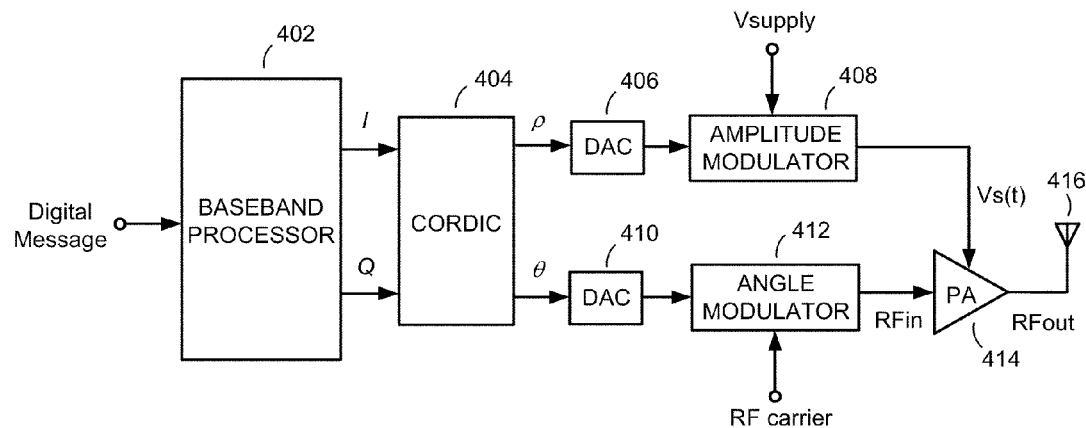
FIG. 4 is a drawing of a conventional polar transmitter.
Figure 5:
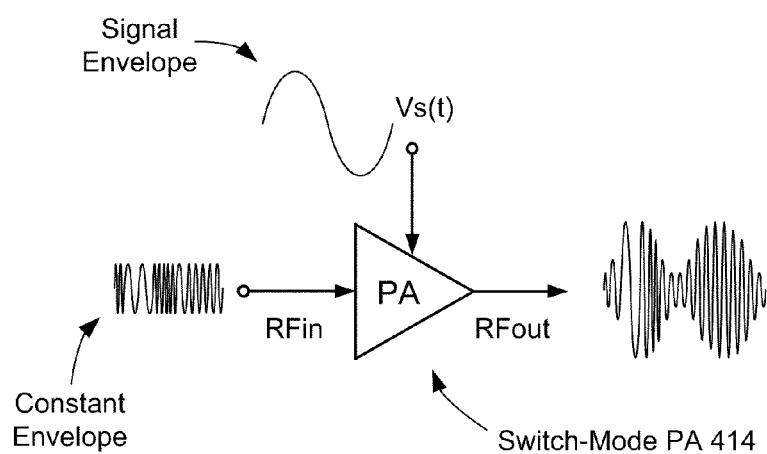
FIG. 5 is a drawing illustrating how the modulated RF carrier signal presented to the RF input port of the PA of a polar transmitter has a constant envelope even when the polar transmitter is configured to operate in accordance with a non-constant envelope modulation scheme.
Figure 6:
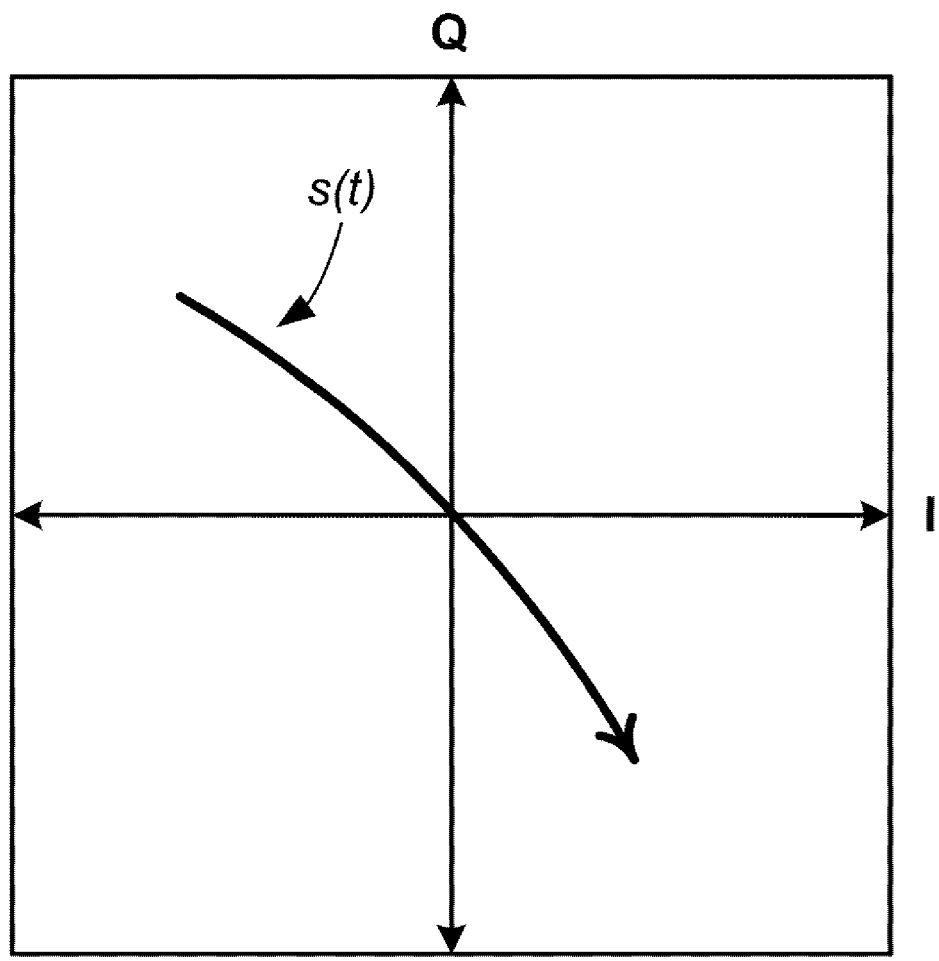
FIG. 6 is a signal trajectory diagram of a baseband signal s(t) that passes through the origin of the complex signal plane.
Figure 7:
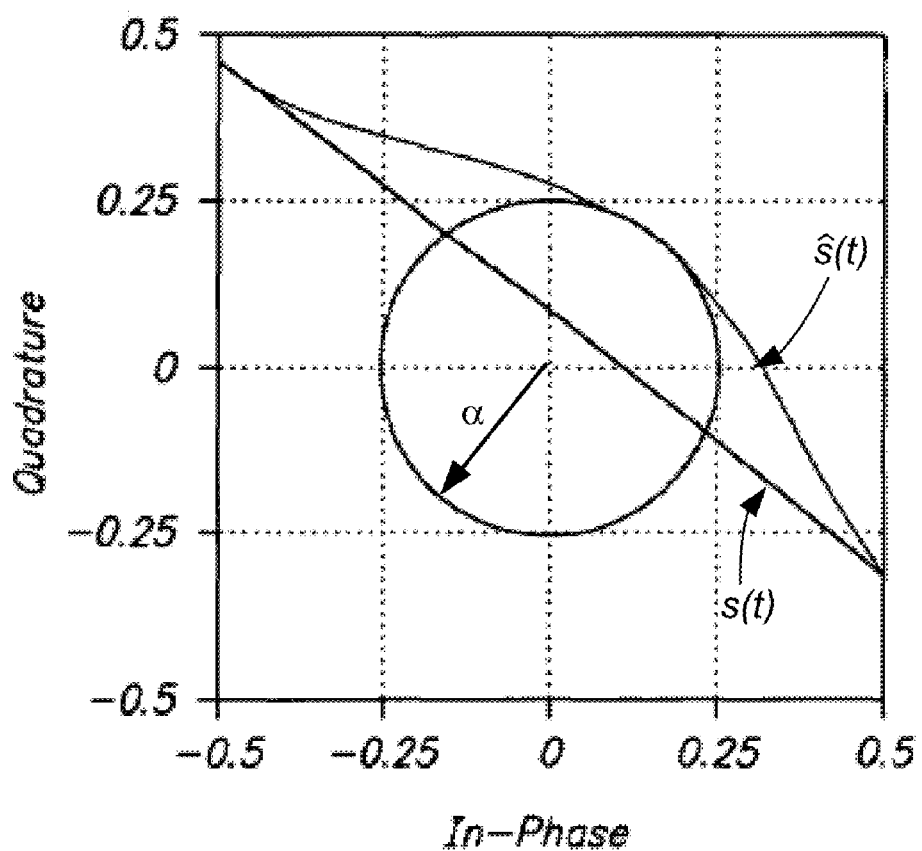
FIG. 7 is a signal trajectory diagram of a baseband signal s(t) and a modified baseband signal ŝ(t) that has been subjected to a conventional hole blowing process.
Figure 8:
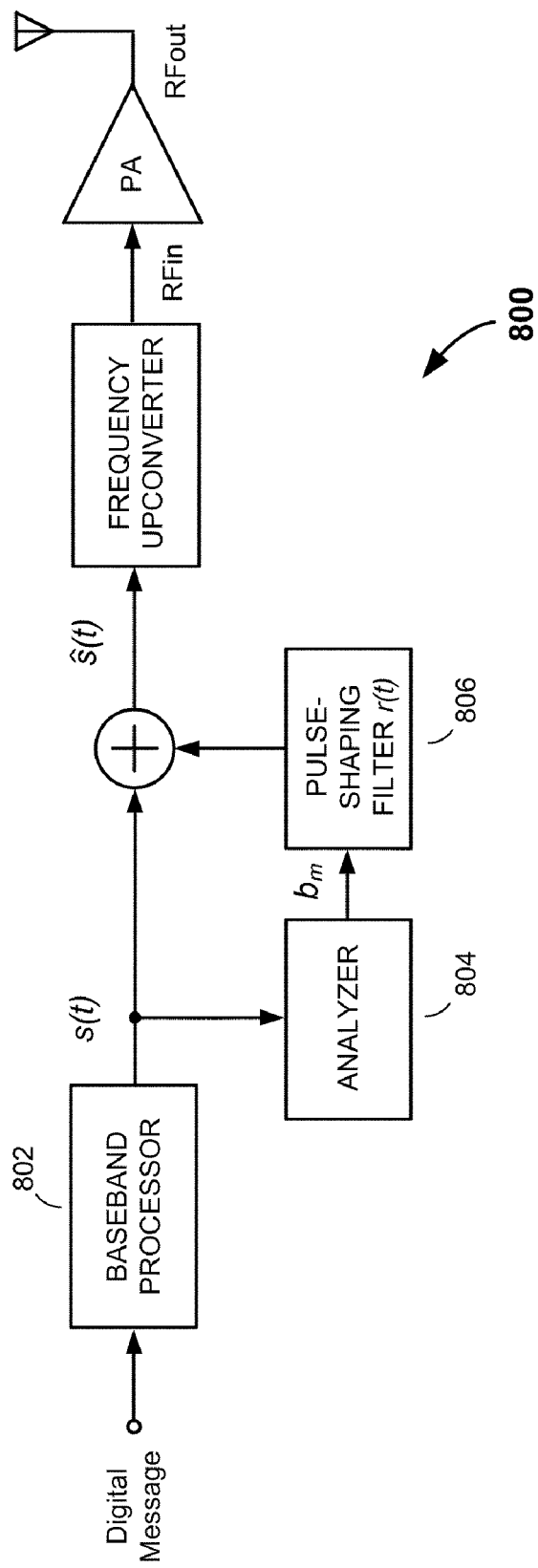
FIG. 8 is a drawing of an RF transmitter that has been supplemented with hole blowing apparatus for performing a conventional hole blowing process.
Figure 9:
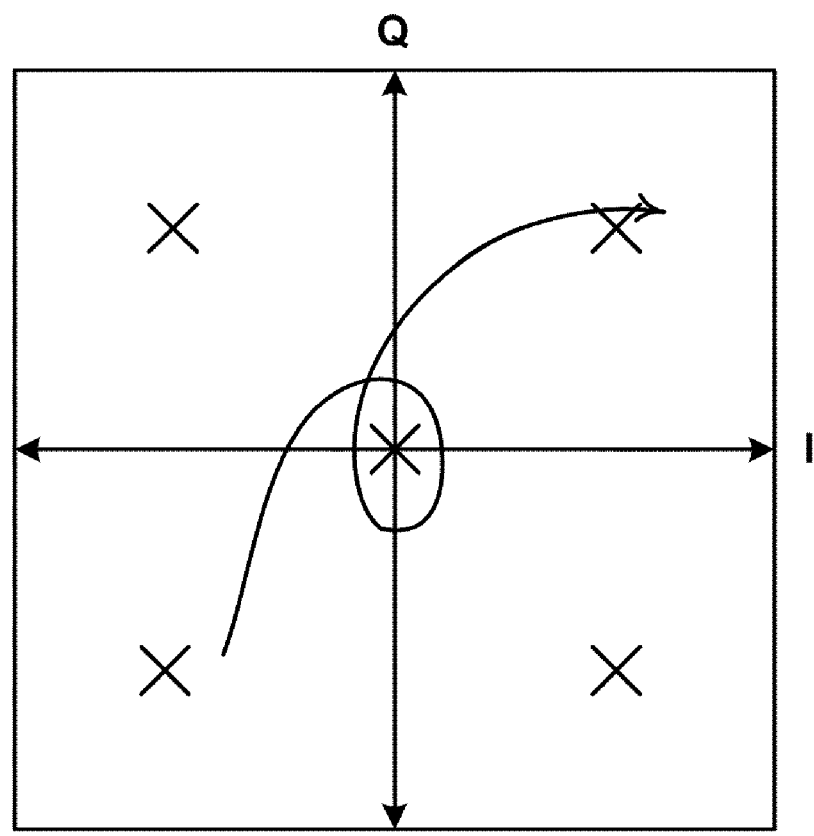
FIG. 9 is a drawing showing the signal constellation of a non-constant envelope modulation scheme and the signal trajectory of a baseband signal s(t) that encircles the origin of the complex signal plane due to the presence of a constellation point centered at the origin.
Figure 10:
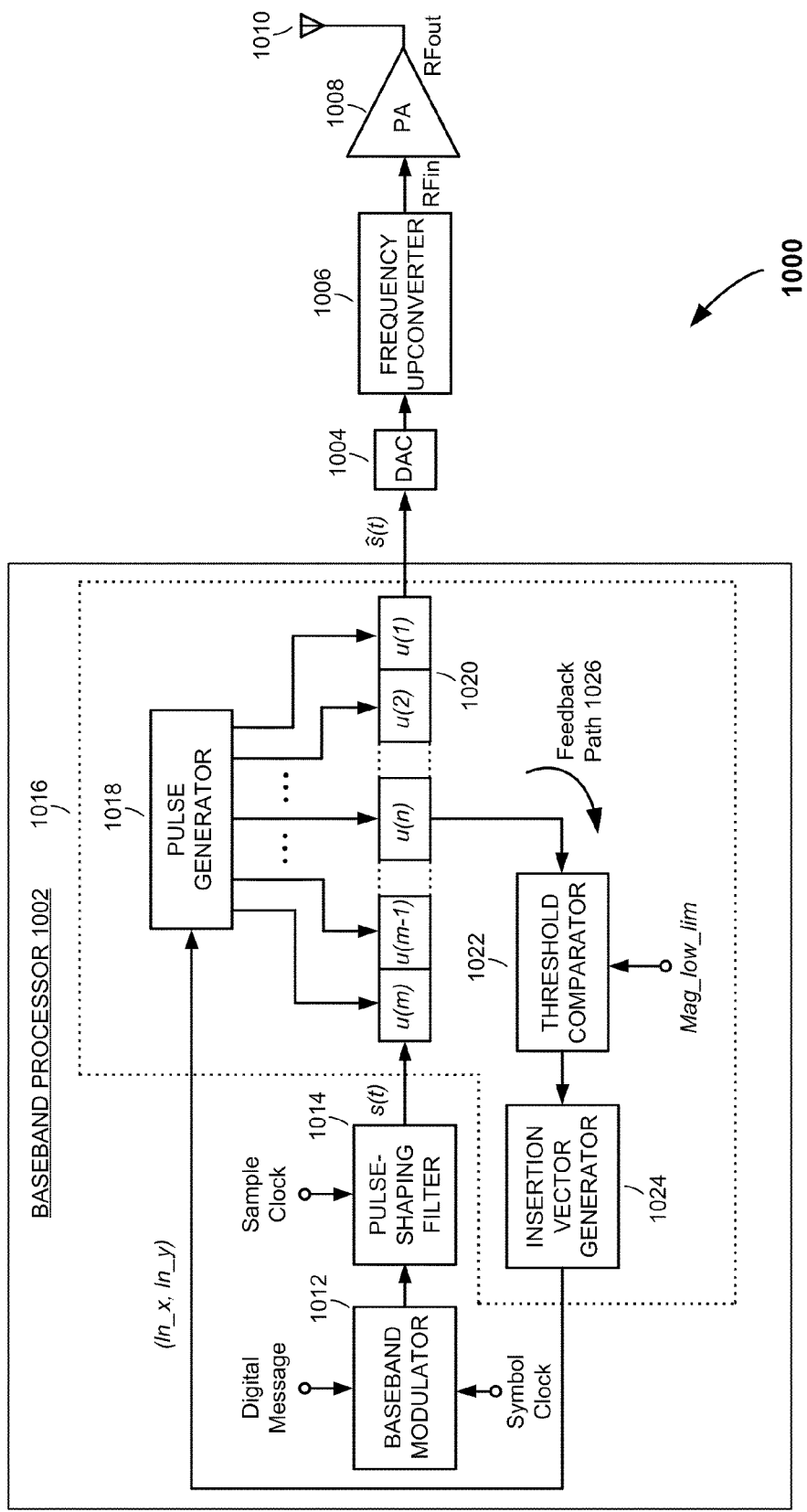
FIG. 10 is a drawing of an RF transmitter, according to an embodiment of the present invention.

Referring to FIG. 10, there is shown a radio frequency (RF) transmitter 1000, according to an embodiment of the present invention. The RF transmitter 1000 comprises a baseband processor 1002, a digital-to-analog converter (DAC) 1004, a frequency upconverter 1006, a power amplifier (PA) 1008, and an antenna 1010. The baseband processor 1002 comprises a baseband modulator 1012, a pulse-shaping filter 1014, and an average-to-minimum power ratio (AMPR) reduction circuit 1016. The baseband processor 1002, DAC 1004, frequency upconverter 1006 and PA 1008 are formed in one or more integrated circuits. In the exemplary embodiment described here, the baseband processor 1002, including the baseband modulator 1012, pulse-shaping filter 1014, and AMPR reduction circuit 1016, are formed as a digital signal processor (DSP) in a single integrated circuit. The DSP may implemented as hardware or a combination of hardware and software, such as a microprocessor, microcontroller, field-programmable gate array, or other programmable or nonprogrammable integrated circuit, as will be appreciated by those of ordinary skill in the art.

The baseband modulator 1012 is configured to generate a sequence of symbols at a symbol clock rate from data bits in a digital message to be transmitted. The sequence of symbols is then filtered by the pulse-shaping filter 1014 and sampled at a sample clock rate to provide a sequence of samples representing a baseband signal s(t).

The modulation scheme employed by the baseband modulator 1012 is a non-constant envelope modulation scheme determined by design requirements or set by a standard. In one embodiment, the RF transmitter 1000 is configured to operate in a third generation (3G) mobile telecommunications system and employs a non-constant envelope modulation schemes standardized by the 3G Partnership Project (3GPP), such as the Hybrid Phase Shift Keying (HPSK) non-constant envelope modulation scheme used in 3G Universal Mobile Telecommunications System (UMTS) networks or one of the non-constant envelope modulation schemes used by the 3G High-Speed Downlink Packet Access (HSDPA) or High-Speed Uplink Packet Access (HSUPA) communication protocols. In another embodiment, the RF transmitter 1000 is configured for operation in a wireless local area network (LAN) and employs an orthogonal frequency division multiplexing (OFDM) non-constant envelope scheme specified in the Institute of Electrical and Electronics Engineers (IEEE) 802.11 body of standards. While the RF transmitter 1000 is suitable for use in UMTS and wireless LAN applications, those of ordinary skill in the art will appreciate and understand that the RF transmitter 1000 is neither limited to use in any particular system or application nor to any particular modulation scheme or standard. In fact, it may be adapted for use in any communications system in which non-a constant envelope modulation is used and in which a high average-to-minimum power ratio (AMPR) is of concern. Further, whereas the exemplary embodiments are described in the context of RF applications, the methods and apparatus of the present invention are not limited to wireless or RF applications, and may be adapted for use in wired transmitters, such as those configured to transmit over a cable or fiber optic link.

As shown in FIG. 10, the AMPR reduction circuit 1016 of the baseband processor 1002 comprises a pulse generator 1018, a chain of registers 1020, a threshold comparator 1022, and an insertion vector generator 1024. The threshold comparator 1022 and insertion vector generator 1024 are configured in a feedback path 1026 between an output of one of the registers in the chain of registers 1020 and an input to the pulse generator 1018.

The chain of registers 1020 is configured to receive samples of the baseband signal s(t) at a sample clock rate. The samples are clocked into and out of the chain of registers 1020 in a first-in first-out fashion to provide a timed sequence of samples u(1), u(2), ..., u(n), ..., u(m−1), u(m), where n and m are positive integers and m>n. In general, each sample in the sequence of samples u(1), u(2), ..., u(n), ..., u(m−1), u(m) is a complex signal sample. So, sample u(n), for example, can be expressed as a vector: (x(n), y(n)) or a complex number u(n)=x(n)+jy(n) in rectangular coordinates; or a phasor in polar coordinates as: $u(n)=Ae^{j\theta}$, where $A=(x(n)^2+y(n)^2)^{1/2}$ and $\theta=\tan^{-1}(y(n)/x(n))$.

As the sequence of samples u(1), u(2), ..., u(n), ..., u(m−1), u(m) is clocked through the chain of registers 1020, one of the samples (sample u(n) in the exemplary embodiment here) is fed back, via the feedback path 1026, to the threshold comparator 1022, which analyzes the sample u(n) by comparing its magnitude to a low-magnitude threshold Mag_low_lim. If the magnitude of the fed back sample u(n) is determined to be below the low-magnitude threshold Mag_low_lim, the insertion vector generator 1024 is directed to generate an insertion vector (In_x, In_y) having attributes (i.e., magnitude and phase) that are determined in accordance with one of several different methods described in detail below.

The pulse generator 1018 is configured to generate an AMPR-reducing pulse that is scaled by the insertion vector (In_x, In_y). The scaled AMPR-reducing pulse is combined with the sequence of samples u(1), u(2), ..., u(n), ..., u(m−1), u(m) in the temporal vicinity of a detected low-magnitude event. Combining the scaled AMPR-reducing pulse with the sequence of samples u(1), u(2), ..., u(n), ..., u(m−1), u(m) has the effect of altering the signal trajectory of the baseband signal s(t) so that it does not have a magnitude that falls below the low-magnitude threshold Mag_low_lim. The result is a modified baseband signal ŝ(t) at the output of chain of registers 1020 having a reduced AMPR.

For optimal performance, the total time it takes for the threshold comparator 1022 to compare the magnitude of the sample u(n) to the low-magnitude threshold Mag_low_lim and the insertion vector generator 1024 to generate the insertion vector (In_x, In_y) should be less than the period of the sample clock. However, if design requirements or hardware constraints do not allow these operations to be completed within one clock cycle, the threshold comparator 1022 and insertion vector generator 1024 can be alternatively configured to perform their respective operations at a lower rate, and the pulse generator 1018 can be configured to insert AMPR-reducing pulses on, say, every I sample clock cycles (where I is an integer greater than or equal to 2) without substantial degradation in AMPR-reduction performance. It should also be mentioned that while AMPR reduction in the exemplary embodiments here are performed after the sequence of symbols from the baseband modulator 1012 have been filtered by the pulse shaping filter 1014 and sampled (i.e., at sample rate timing), the AMPR-reducing methods and apparatus may be modified and adapted to perform AMPR reduction prior to pulse shaping, i.e., at symbol rate timing.

After an AMPR-reducing pulse has been combined with the sequence of samples u(1), u(2), ..., u(n), ..., u(m−1), u(m) in the chain of registers 1020, the sequence of samples u(1), u(2), ..., u(n), ..., u(m−1), u(m) is shifted from left to right on the next cycle of the sample clock, a new and yet-to-be-modified sample u(m+1) is clocked into the chain of registers 1020, and the above-described process is repeated. With the benefit of feedback, the AMPR reduction circuit 1016 is able to verify whether the previously introduced AMPR-reducing pulse was sufficient at altering the signal trajectory of the baseband signal s(t) so that its magnitude remains above the low-magnitude threshold Mag_low_lim. If it was not, as determined by the magnitude of the newly fed back sample relative to the low-magnitude threshold Mag_low_lim, the insertion vector generator 1024 generates a new insertion vector (In_x, In_y), which the pulse generator 1018 uses to form a new AMPR-reducing pulse. The new AMPR-reducing pulse is combined with the shifted samples u(2), u(3), ..., u(n), ..., u(m), u(m+1) to alter the signal trajectory of the baseband signal s(t) further. This process is performed continuously to ensure that the magnitude of the baseband signal s(t) always remains above the low-magnitude threshold Mag_low_lim.

As the AMPR reduction circuit 1016 operates to reduce the AMPR of the baseband signal s(t), a modified baseband signal ŝ(t) having a lower AMPR is produced at the output of the chain of registers 1020. The DAC 1004 converts the modified baseband signal ŝ(t) to an analog baseband signal. The analog baseband signal is then upconverted to RF by the frequency upconverter 1006 and applied to the RF input RFin of the PA 1008. Finally, the antenna 1010 radiates the amplified and modulated RF carrier signal over the air to a remote receiver.

Figure 11:
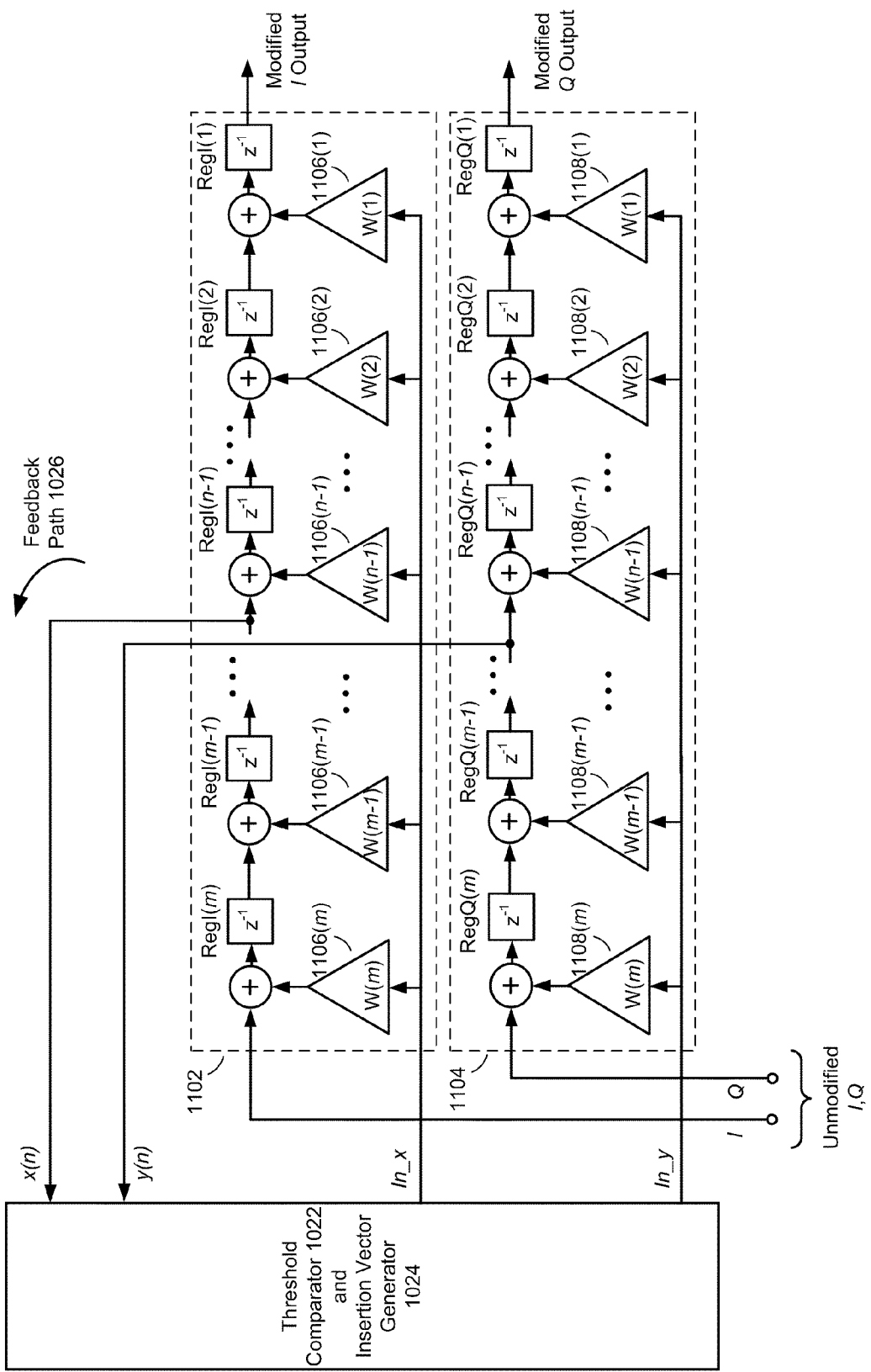
FIG. 11 is a drawing illustrating how the average-to-minimum power ratio (AMPR) of the baseband signal s(t) in the RF transmitter in FIG. 10 can be reduced using a pulse generator comprised of in-phase (I) and quadrature (Q) phase tapped delay lines.

According to one embodiment of the invention illustrated in FIG. 11, the sequence of samples u(1), u(2), ..., u(m) is processed in terms of its in-phase (I) and quadrature (Q) phase components, and the chain of registers 1020 and pulse generator 1018 of the AMPR reduction circuit 1016 are amalgamated into first and second (i.e., I- and Q-channel) tapped delay lines 1102 and 1104. As shown in FIG. 11, the I-channel tapped delay line 1102 includes a first plurality of registers RegI(1), RegI(2), ..., RegI(m) and a first plurality of multipliers 1106(1), 1106(2), ..., 1106($m$), which are individually weighted by a plurality of weighting coefficients W(1), W(2), ..., W(m). The Q-channel tapped delay line 1104 includes a second plurality of registers RegQ(1), RegQ(2), ..., RegQ(m) and a second plurality of multipliers 1108(1), 1108(2), ..., 1108($m$), which are weighted by the same plurality of weighting coefficients W(1), W(2), ..., W(m).

The weighting coefficients W(1), W(2), ..., W(m) determine the shape of the AMPR-reducing pulses, and may be set so that the AMPR-reducing pulses are triangular, Gaussian, root-raised cosine, or any other suitable shape. In one embodiment m is an odd-numbered integer, n−1 represents the center of each AMPR-reducing pulse, and the weights of the weighting coefficients W(1), W(2), ..., W(m) are set so that they are symmetric about n−1, with the weighting coefficient W(n−1) having the largest value. The actual values of the weighting coefficients W(1), W(2), ..., W(m) are determined during design (e.g., using modeling, simulation and/or test measurement data). For example, in one embodiment, modeling and simulation data are used to establish the weighting coefficients W(1), W(2), ..., W(m) so that the RF transmitter 1000 complies with a desired balance of in-band and out-of-band performance metrics, such as error vector magnitude (EVM) and adjacent channel leakage ratio (ACLR).

The first plurality of registers RegI(1), RegI(2), ..., RegI(m) of the I-channel tapped delay line 1102 is configured to store the x coordinates (i.e., I coordinates) of the sequence of samples u(1), u(2), ..., u(m) and the x coordinate of a yet-to-be-modified sample u(m+1). Specifically, the x coordinates in registers RegI(1) through RegI(m−1) are formed by individually summing the outputs of registers RegI(2) through RegI(m) with the outputs of multipliers 1106(1) through 1106($m$−1), while the x coordinate in register RegI(m) is formed by summing the x coordinate of the yet-to-be-modified sample u(m+1) with the output of the $m^{th}$ multiplier 1106($m$). The outputs of the first plurality of multipliers 1106(1), 1106(2), ..., 1106($m$) are determined by scaling the weighting coefficients W(1), W(2), ..., W(m) by the value of the x-coordinate In_x of the insertion vector (In_x, In_y).

Similarly, the second plurality of registers RegQ(1), RegQ(2), ..., RegQ(m) of the Q-channel tapped delay line 1104 is configured to store the y coordinates (i.e., Q-coordinates) of the sequence of samples u(1), u(2), ..., u(m) and the y coordinate of the yet-to-be-modified sample u(m+1). Specifically, the y coordinates in registers RegQ(1) through RegQ(m−1) are formed by individually summing the outputs of registers RegQ(2) through RegQ(m) with the outputs of multipliers 1108(1) through 1108($m$−1), while the y coordinate in register RegQ(m) is formed by summing the y coordinate of the yet-to-be-modified sample u(m+1) with the output of the $m^{th}$ multiplier 1108($m$). The outputs of the second plurality of multipliers 1108(1), 1108(2), ..., 1108($m$) are determined by scaling the weighting coefficients W(1), W(2), ..., W(m) by the value of the y-coordinate In_y of the insertion vector (In_x, In_y).

At the rising edge of each sample clock cycle, the x coordinates of samples u(2) through u(m) in registers RegI(2) through RegI(m) of the first plurality of registers RegI(1), RegI(2), ..., RegI(m) are individually summed with the outputs of multipliers 1106(1) through 1106($m$−1) and clocked into RegI(1) through RegI(m−1); the y coordinates of samples u(2) through u(m) in registers RegQ(2) through RegQ(m) of the second plurality of registers RegQ(1), RegQ(2), ..., RegQ(m) are individually summed with the outputs of multipliers 1108(1) through 1108($m$−1) and clocked into RegQ(1) through RegQ(m−1); and the x and y coordinates of the new and yet-to-be modified sample u(m+1) are summed with the outputs of multipliers 1106($m$) and 1108($m$), respectively, and clocked into RegI(m) and RegQ(m). After these operations have been completed, and prior to the next rising edge of the sample clock, the sample in registers RegI(n) and RegQ(n), i.e., x(n) and y(n), which has been analyzed on prior clock cycles and which may also have been modified (depending on whether prior AMPR-reducing pulses had been inserted), is fed back to the threshold comparator 1022, via the feedback path 1026. The threshold comparator 1022 responds by detecting whether the magnitude $[x(n)^2+y(n)^2]^{1/2}$ of the fed back sample u(n) falls below the predetermined low-magnitude threshold Mag_low_lim. If it does, the insertion vector generator 1024 responds by generating a new insertion vector (In_x, In_y). The new insertion vector (In_x, In_y) is used by the I- and Q-channel tapped delay lines 1102 and 1104 to scale a new AMPR-reducing pulse. With the values of the registers being continually updated and shifted through the first and second tapped delay lines 1102 and 1104, and fed back to the threshold comparator 1022 and insertion vector generator 1024, the AMPR reduction circuit 1016 is able to monitor the signal trajectory of the baseband signal and modify samples multiple times, if necessary, to ensure that the magnitude of the modified baseband signal ŝ(t) always remains above the low-magnitude threshold Mag_low_lim.

Like the other portions of the AMPR reduction circuit 1016, the threshold comparator 1022 and insertion vector generator 1024 may be implemented in the baseband processor 1002 as hardware or a combination of hardware and software. The processes of detecting low-magnitude events and generating the insertion vector (In_x, In_y) are performed according to one of a various AMPR pulse decision and insertion vector generator methods, three examples of which are shown in FIGS. 12-14.

Figure 12:
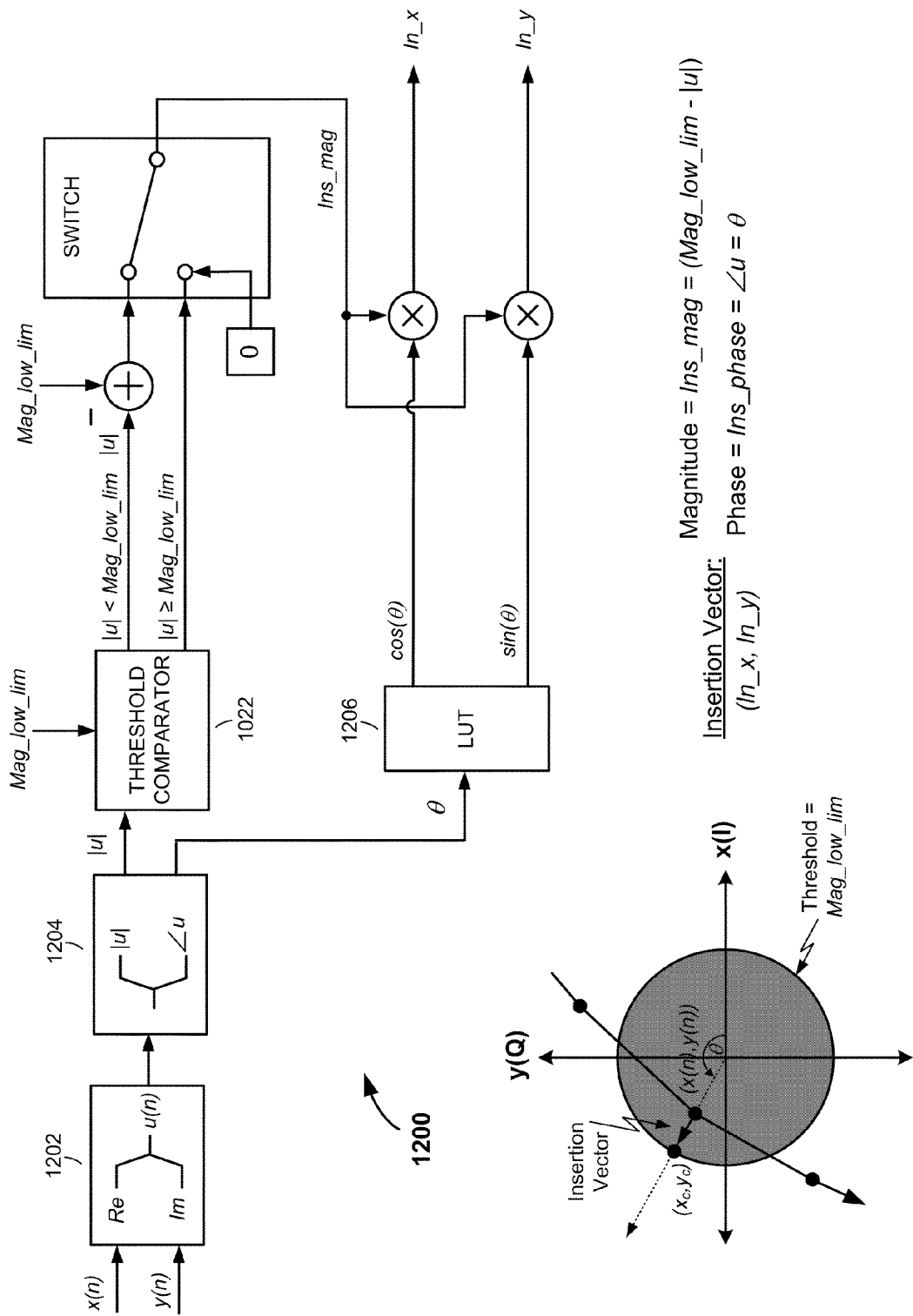
FIG. 12 is a drawing of a first AMPR pulse decision and insertion vector generator method, according to an embodiment of the present invention.

According to the first AMPR pulse decision and insertion vector generator method 1200 illustrated in FIG. 12, the angle (i.e., the phase) Ins_phase of the insertion vector (In_x, In_y) is set equal to the phase ∠u(n)=θ of the vector (x(n), y(n)) defining the fed back sample u(n) in the complex signal plane, and the magnitude Ins_mag of the insertion vector (In_x, In_y) is determined based on the magnitude |u(n)| of the fed back sample u(n) relative to the magnitude $(x_c^2+y_c^2)^{1/2}$ of a low-magnitude threshold vector $(x_c, y_c)$ that is parallel to (x(n), y(n)) and terminates on a circle of radius Mag_low_lim centered at the origin. The first step in the AMPR pulse decision and insertion vector generator method 1200 is performed at block 1202, where the x and y coordinates x(n) and y(n) (i.e., the real (Re) and imaginary (Im) components) of the fed back sample u(n) are combined. At block 1204 the magnitude |u(n)| and phase ∠u(n)=θ of the fed back sample u(n) are calculated. Next, the threshold comparator 1022 operates to compare the magnitude |u(n)| of the fed back sample u(n) to the low-magnitude threshold Mag_low_lim. If the threshold comparator 1022 determines that |u(n)|≧Mag_low_lim, the magnitude Ins_mag of the insertion vector (In_x, In_y) is set to zero. Otherwise, the magnitude Ins_mag of the insertion vector (In_x, In_y) is set equal to Ins_mag=(Mag_low_lim−|u(n)|). Meanwhile, the cosine and sine of the phase of the ∠u(n)=θ of the vector (x(n), y(n)) are determined, either by direct calculation or by use of a look up table (LUT) 1206. Finally, the x and y coordinates In_x and In_y of the insertion vector (In_x, In_y) are calculated by multiplying the magnitude Ins_mag of the insertion vector (In_x, In_y) by cos(θ) and sin(θ), respectively. Note that when no AMPR-reducing pulse is to be generated, the insertion vector coordinates are set to zero, i.e., (In_x, In_y)=(0, 0).

Figure 13:
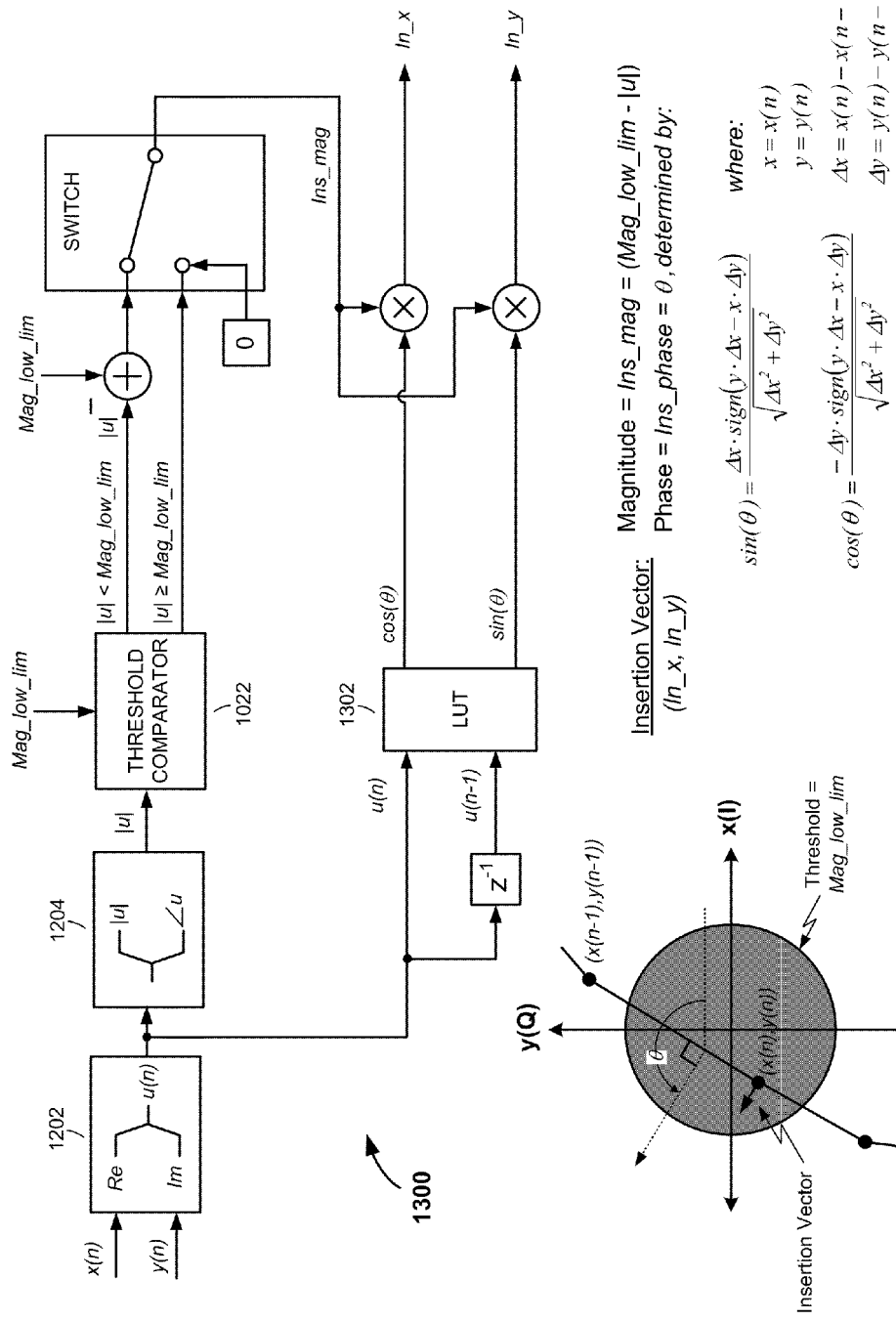
FIG. 13 is a drawing of a second AMPR pulse decision and insertion vector generator method, according to an embodiment of the present invention.
Figure 14:
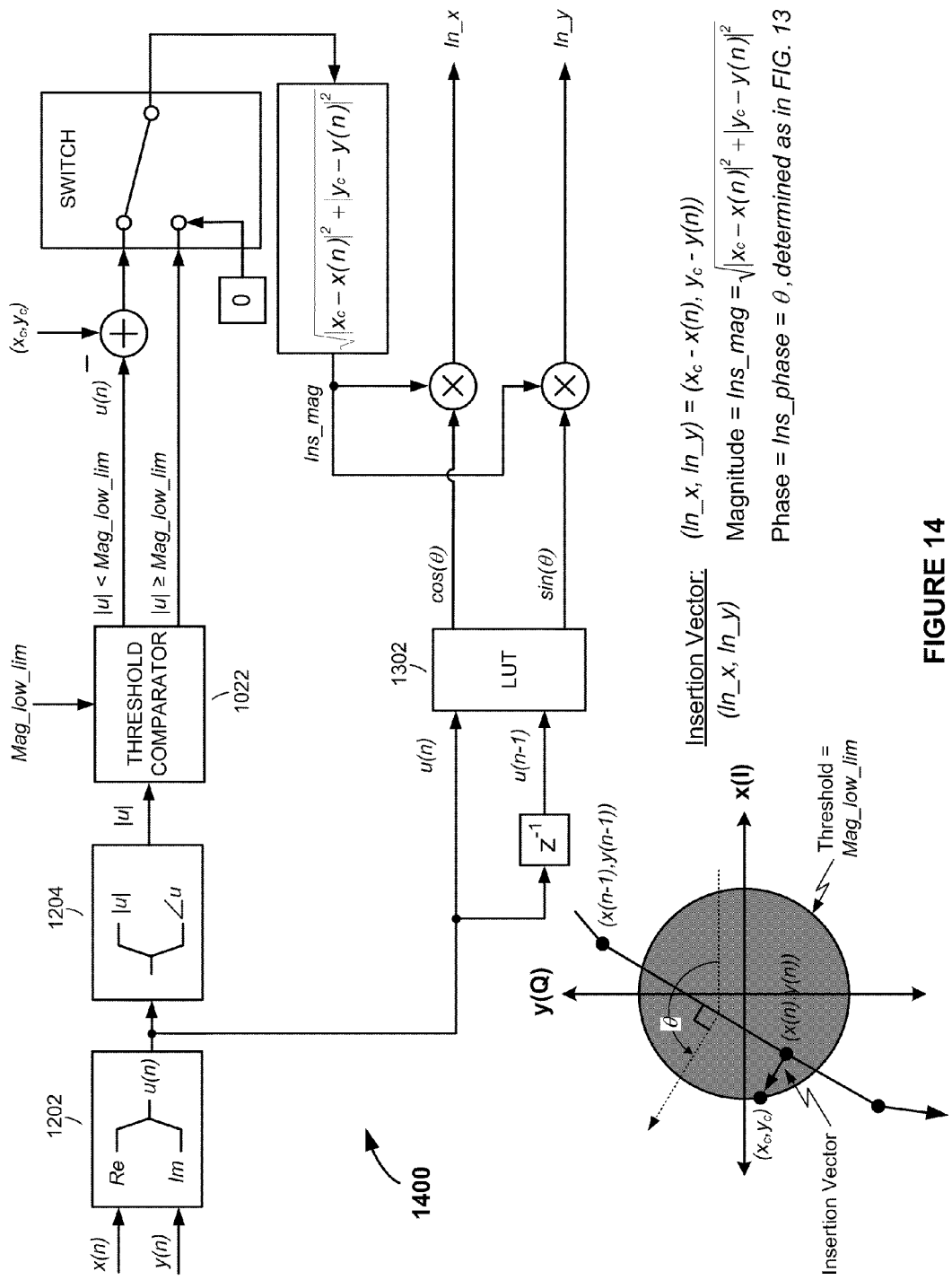
FIG. 14 is a drawing of a third AMPR pulse decision and insertion vector generator method, according to an embodiment of the present invention.

FIG. 13 is a drawing illustrating a second AMPR pulse decision and insertion vector generator method 1300. Similar to the AMPR pulse decision and insertion vector generator method 1200 in FIG. 12, the magnitude Ins_mag of the insertion vector (In_x, In_y) is set to zero if the threshold comparator 1022 determines that |u(n)|≧Mag_low_lim, and set equal to Ins_mag=(Mag_low_lim−|u(n)|) if the threshold comparator 1022 determines that |u(n)|≦Mag_low_lim. However, the phase Ins_phase of the insertion vector (In_x, In_y) is determined differently than in the first method 1200. According to this second AMPR pulse decision and insertion vector generator method 1300, the phase Ins_phase of the insertion vector (In_x, In_y) is determined based on a vector that is orthogonal (i.e., perpendicular) to a line approximating the signal trajectory between the fed back sample u(n) and another sample in the sequence of samples u(1), u(2), . . . , u(m) (in this example, a prior sample u(n−1)). Specifically, the cosine and sine of the phase Ins_phase of the insertion vector (In_x, In_y) are determined by the following formulas:

$$\sin(\theta) = \frac{\Delta x \cdot \text{sign}(y \cdot \Delta x - x \cdot \Delta y)}{\sqrt{\Delta x^2 + \Delta y^2}}, \cos(\theta) = \frac{-\Delta y \cdot \text{sign}(y \cdot \Delta x - x \cdot \Delta y)}{\sqrt{\Delta x^2 + \Delta y^2}},$$

where x=x(n), y=y(n), Δx=x(n)−x(n−1), Δy=y(n)−y(n−1), and sign(y·Δx−x·Δy) is a sign factor (positive or negative) that determines the direction of the insertion vector (In_x, In_y) and ensures that the phase Ins_phase is such that the insertion vector (In_x, In_y) pushes the fed back sample u(n) away from the origin (rather than towards it). To avoid having to compute cos(θ) and sin(θ) for each insertion vector (In_x, In_y), a plurality of values of cos(θ) and sin(θ) can be configured in a LUT 1302 and indexed according to the magnitudes of the fed back sample u(n) and prior sample u(n−1), as illustrated in FIG. 13.

FIG. 14 is a drawing illustrating a third AMPR pulse decision and insertion vector generator method 1400. According to this third method 1400, the phase Ins_phase=θ of the insertion vector (In_x, In_y) is determined similar to as in the second method 1300 in FIG. 13, i.e., based on a vector that is orthogonal (i.e., perpendicular) to a line approximating the signal trajectory between successive samples. However, the magnitude Ins_mag of the insertion vector (In_x, In_y) is determined differently. According to this third AMPR pulse decision and insertion vector generator method 1400, the magnitude Ins_mag of the insertion vector (In_x, In_y) is determined by calculating the magnitude of a vector $(x_c−x(n), y_c−y(n))$ that originates at the location of the fed back sample u(n), is orthogonal to the signal trajectory between the fed back sample u(n) and the prior sample u(n−1), and terminates on the low-magnitude threshold circle. In other words, the magnitude Ins_mag is calculated as follows: $\{|x_c−x(n)|^2+|y_c−y(n)|^2\}^{1/2}$.

Figure 15:
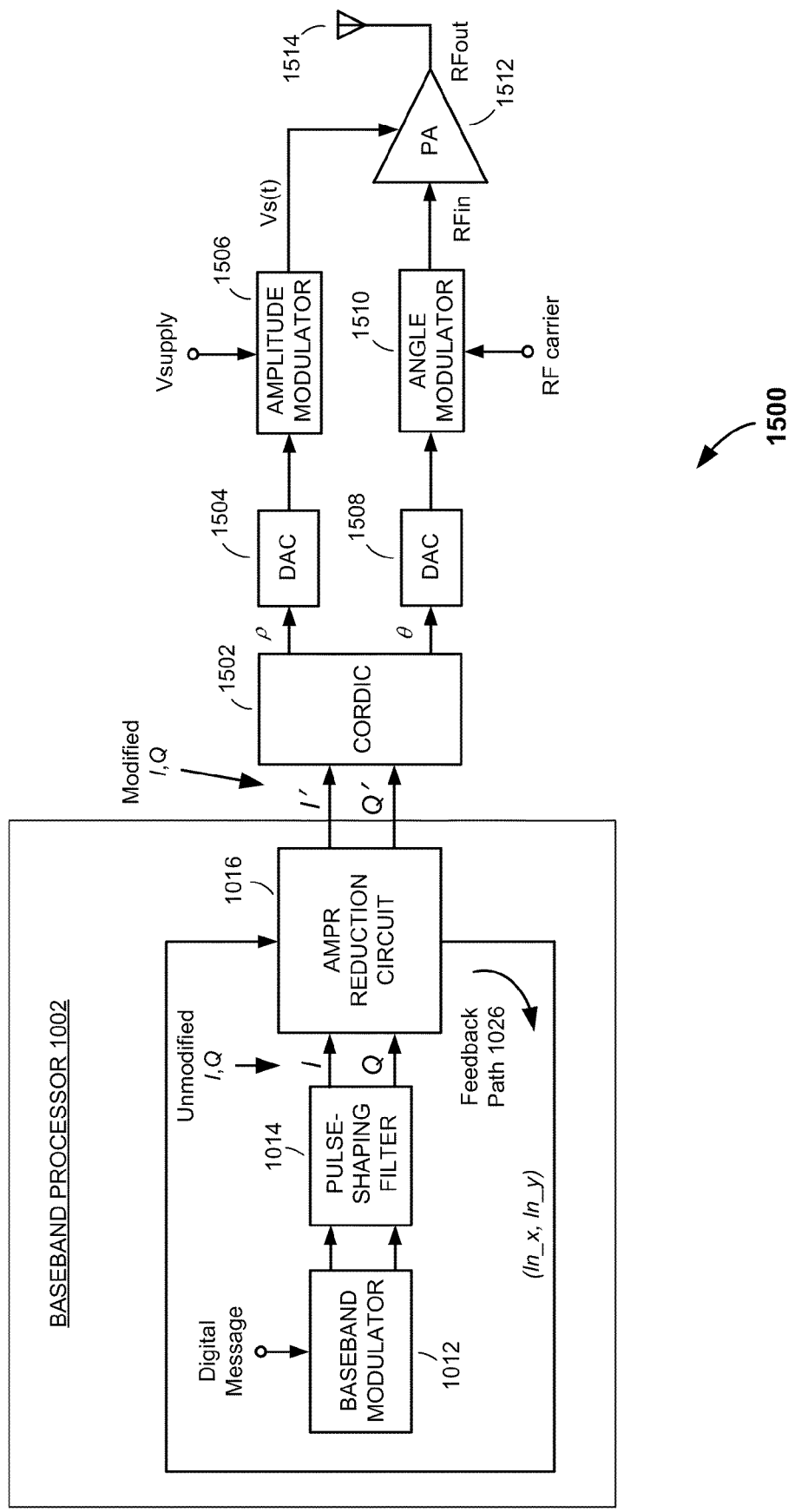
FIG. 15 is a drawing of a polar transmitter including an AMPR-reducing circuit that is operable to reduce the AMPR of a baseband signal s(t) using one of the AMPR pulse decision and insertion vector generator methods in FIGS. 12-14, according to an embodiment of the present invention.
Figure 19A:
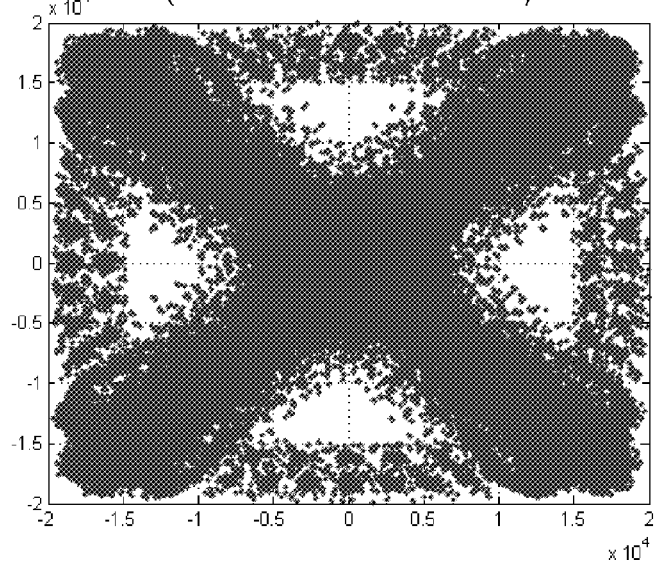
FIGS. 19A-D are signal trajectory diagrams of an exemplary High-Speed Packet Access (HSPA) signal taken from simulations performed on a polar transmitter, similar to the polar transmitter in FIG. 15, without the benefit of any AMPR reduction (FIG. 19A) and in accordance with the first, second and third AMPR pulse decision and insertion vector generator methods (FIGS. 19B-D, respectively) in FIGS. 12-14.
Figure 19B:
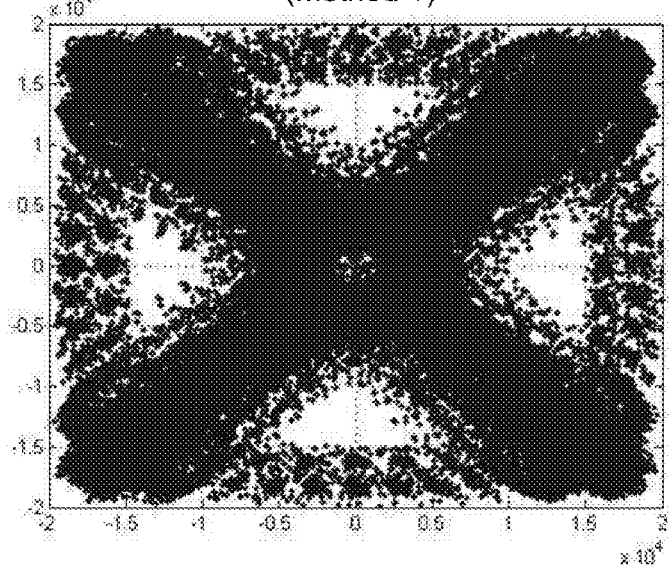
Figure 19C:
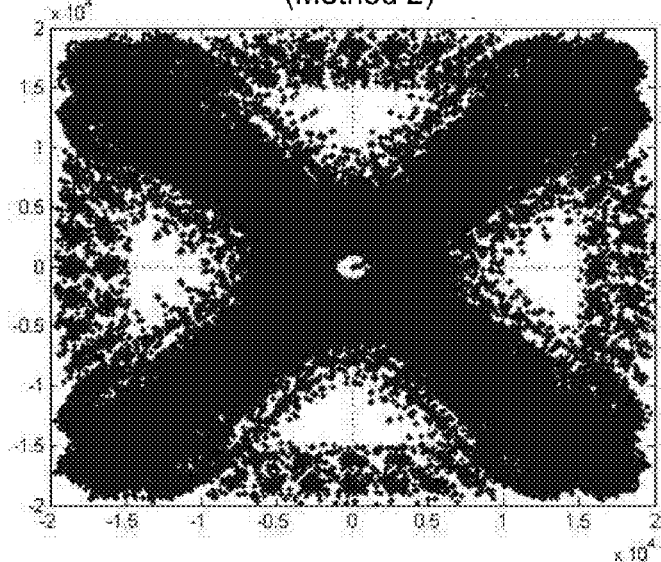
Figure 19D:
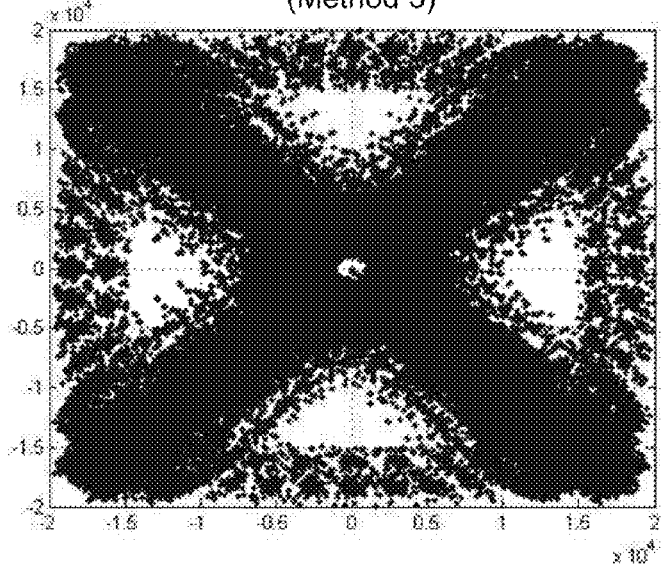

The AMPR-reducing methods and apparatus described above can be advantageously employed in any type of transmitter in which a high AMPR is of concern. For example, FIG. 15 is a drawing illustrating how the AMPR-reducing methods and apparatus may be used to reduce high-frequency events in the amplitude and angle component signals ρ and θ of a polar transmitter 1500. The polar transmitter 1500 comprises a baseband processor 1002, including an AMPR reduction circuit similar to the AMPR reduction circuit 1016 described in FIGS. 10 and 11 above; a Coordinate Rotation Digital Computer (CORDIC) converter (i.e., rectangular-to-polar converter) 1502; an amplitude path including an amplitude path DAC 1504 and amplitude modulator 1506; an angle path including an angle path DAC 1508 and angle modulator 1510; a PA 1512; and an antenna 1514.

The AMPR reduction circuit 1016 operates on the baseband signal s(t)=I(t)+jQ(t) generated by the baseband modulator 1012 and pulse-shaping filter 1014, according to one of the AMPR pulse decision and insertion vector generator methods 1200, 1300 and 1400 described above, thereby providing a modified baseband signal ŝ(t) comprised of modified I and Q signal components I'(t) and Q'(t).

The modulation scheme employed by the baseband modulator 1012 is a non-constant envelope modulation scheme. In one embodiment, the baseband modulator 1012 and pulse-shaping filter 1014 are configured to generate a baseband signal s(t) that is modulated according to the HPSK non-constant envelope modulation scheme specified by the 3GPP for use in 3G UMTS systems. In another embodiment, the baseband modulator 1012 and pulse-shaping filter 1014 are configured to employ a non-constant envelope modulation scheme specified for use in the 3G High-Speed Packet Access (HSPA) communication protocols. In yet another embodiment, the polar transmitter 1500 is configured for operation in a wireless LAN and employs an OFDM non-constant envelope scheme, such as specified by the IEEE 802.11 body of standards.

After the baseband modulator 1012 and pulse-shaping filter 1014 have generated the baseband signal s(t)=I(t)+jQ(t) and the AMPR reduction circuit 1016 has reduced the AMPR of the baseband signal s(t), the CORDIC converter 1502 converts the rectangular-coordinate modified I' and Q' signal components of the resulting modified baseband signal ŝ(t) to digital polar-coordinate amplitude and angle component signals ρ and θ. Due to the prior AMPR-reducing operation performed by the AMPR reduction circuit 1016, the digital polar-coordinate amplitude and angle component signals ρ and θ have reduced high-frequency content.

The AMPR-reduced digital polar-coordinate amplitude and angle component signals ρ and θ are converted to analog amplitude and angle modulation signals by the amplitude and angle path DACs 1504 and 1508. The amplitude modulator 1506 modulates a direct current power supply voltage Vsupply in the amplitude path according to the amplitude information in the analog amplitude modulation signal. The resulting amplitude-modulated power supply signal Vs(t) is coupled to the power supply port of the PA 1512. Meanwhile, in the angle path the angle modulator 1510 operates to modulate an RF carrier signal according to the angle information in the analog angle modulation signal, to produce an angle-modulated RF carrier signal.

The PA 1512 comprises an amplifier having a final-stage switch-mode type of PA (e.g., as a Class D, E or F switch-mode PA) operating between compressed and cut-off states. As the PA 1512 amplifies the angle-modulated RF carrier signal produced at the output of the angle modulator 1510 the envelope information in the amplitude-modulated power supply signal Vs(t) from the amplitude modulator 1506 is restored at the RF output RFout of the PA 1512. Finally, the antenna 1514 radiates the final amplified amplitude- and angle-modulated RF carrier signal over the air to a remote receiver.

FIGS. 16-18 are tables summarizing simulation results of a polar transmitter, similar to the polar transmitter 1500 in FIG. 15, configured for operation in Band V of a UMTS mobile telecommunications system. The simulation results were obtained from simulations performed on three different design examples. In the first design example, the baseband processor of the polar transmitter was configured to generate HPSK signals. In the second and third design examples, the baseband processor was configured to generate HSDPA signals and HSUPA signals. The simulation results for the first, second and third design examples are summarized in FIGS. 16, 17 and 18, respectively. They each include first and second adjacent channel leakage ratios (ACLR5 and ACLR10), receive band noise power 45 MHz from the center frequency of the transmit channel (RxN45) and EVM simulation results for the three different AMPR pulse decision and insertion vector generator methods 1200, 1300 and 1400 described above in connection with FIGS. 12-14. The simulation results are compared to applicable 3GPP specifications in the tables. As can be seen, AMPR reduction was effective for all three design examples and for all three AMPR pulse decision and insertion vector generator methods, providing at least a 10 dB reduction in AMPR in all cases. The ACRL5, ACLR10 and RxN45 noise simulation results for all three design examples are also seen to satisfy the 3GPP ACRL5, ACLR10 and RxN45 noise specifications for all three AMPR pulse decision and insertion vector generator methods 1200, 1300, 1400. Finally, even with application of the AMPR pulse decision and insertion vector generator methods 1200, 1300, 1400, the EVM for all three design examples is seen to remain substantially below the 17.5% 3GPP limit in all cases.

FIGS. 19A-D are signal trajectory diagrams of an exemplary HSPA signal taken from simulations performed on a polar transmitter without the benefit of any AMPR reduction and with the benefit of the first, second and third AMPR pulse decision and insertion vector generator methods 1200, 1300 and 1400 described above in connection with FIGS. 12-14. Without the benefit of AMPR reduction (FIG. 19A) the signal trajectory of the HSPA signal is seen to frequently pass through the origin, occurrences that result in high-frequency events in the polar domain amplitude and angle component signals ρ and θ. Application of the AMPR pulse decision and insertion vector generator methods 1200, 1300 and 1400 has the beneficial effect of pushing the signal trajectory away from the origin, as can be seen by the holes that are blown through and near the origin in FIGS. 19B-D. The results are a lower AMPR and a reduction in high-frequency content in the polar domain amplitude and angle component signals ρ and θ. The reduction in high-frequency content not only affords the ability to more easily satisfy out-of-band noise restrictions imposed by communications standards, it also relaxes the design requirements and reduces the overall complexity of the polar transmitter, such as analog filtering requirements (not shown in FIG. 15) following the conversion of the angle component signals ρ and θ to analog waveforms.

Figure 20:
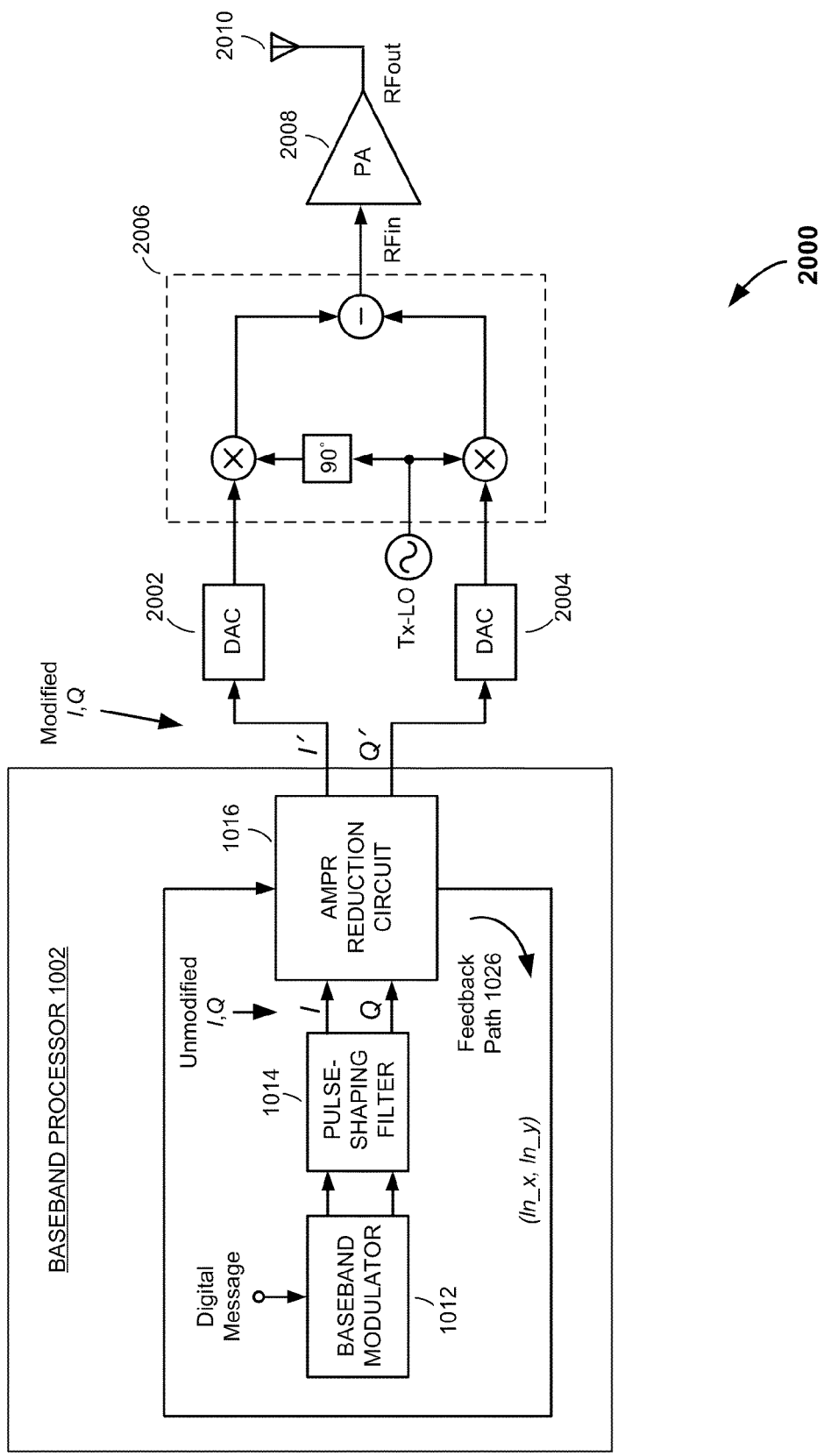
FIG. 20 is a drawing of a quadrature-modulator-based transmitter including an AMPR-reducing circuit that is operable to reduce the AMPR of a baseband signal s(t) using one of the AMPR pulse decision and insertion vector generator methods in FIGS. 12-14, according to an embodiment of the present invention.

The simulation results in FIGS. 16-19 demonstrate the effectiveness of the AMPR-reducing methods and apparatus of the present invention in reducing high-frequency in the amplitude and angle component signals ρ and θ of a polar transmitter. The benefits of applying the AMPR-reducing methods and apparatus of the present invention may also be exploited in other transmitter topologies, such as in the quadrature-modulator-based transmitter 2000 in FIG. 20. As shown in FIG. 20, the quadrature-modulator-based transmitter 2000 comprises a baseband processor 1002 having an AMPR reduction circuit similar to the AMPR reduction circuit 1016 described in FIGS. 10 and 11 above; an I-channel DAC 2002; a Q-channel DAC 2004; a quadrature modulator 2006; a PA 2008; and an antenna 2010. The AMPR reduction circuit 1016 operates on a non-constant envelope baseband signal s(t)=I(t)+jQ(t) generated by the baseband modulator 1012 and pulse-shaping filter 1014, according to one of the AMPR pulse decision and insertion vector generator methods 1200, 1300 and 1400 described above, to provide a modified baseband signal s(t) comprised of modified I and Q signal components I' and Q'. The modified I and Q signal components I' and Q' are converted to analog signals by the I- and Q-channel DACs 2002 and 2004, and then upconverted to RF and combined by the quadrature modulator 2006. The PA 2008 comprises a linear PA (e.g., a Class A, B or AB PA) and operates to amplify the modulated RF carrier signal produced by the quadrature modulator 2006. Finally, the antenna 2010 radiates the amplified and modulated RF carrier signal over the air to a remote receiver. Due to the prior reduction in AMPR of the I and Q signal components, the extent to which power must be backed off to maintain PA linearity is reduced, thereby easing the design requirements of the PA 2008, in particular its required dynamic range.

While various embodiments of the present invention have been described above, it should be understood that they have been presented by way of example, and not limitation. It will be apparent to persons skilled in the relevant art that various changes in form and detail may be made therein without departing from the spirit and scope of the invention. The scope of the invention should, therefore, be determined not with reference to the above description, but should instead be determined with reference to the appended claims, along with the full scope of equivalents to which such claims are entitled.

What is claimed is:

1. A baseband circuit for a communications transmitter, comprising:
   a baseband modulator configured to generate a sequence of symbols formatted in accordance with a non-constant envelope modulation scheme;
   a pulse-shaping filter configured to band-limit said sequence of samples and provide a sequence of samples; and
   an average-to-minimum power ratio (AMPR) reduction circuit configured to:
   determine if a sample in said sequence of samples that has been previously analyzed by said AMPR reduction circuit;
   determine if said previously analyzed sample has a magnitude less than a low-magnitude threshold;
   when said previously analyzed sample has a magnitude less than a low magnitude threshold, analyze and modify at least said previously analyzed sample in said sequence of samples.

2. The baseband circuit of claim 1 wherein when said previously analyzed sample has a magnitude less than a low magnitude threshold said AMPR reduction circuit comprises a pulse generator configured to generate and combine an AMPR-reducing pulse with samples in said sequence of samples.

3. The baseband circuit of claim 2 wherein said sequence of samples is processed in terms of its in-phase (I) and quadrature-phase (Q) components and said pulse generator is configured to generate an AMPR-reducing pulse having I and Q components.

4. The baseband circuit of claim 2 wherein said AMPR reduction circuit comprises a plurality of registers configured to receive and store said sequence of samples.

5. The baseband circuit of claim 4 wherein said plurality of registers and said pulse generator are formed as in-phase channel (I-channel) and quadrature-phase channel (Q-channel) tapped delay lines.

6. The baseband circuit of claim 4 wherein said AMPR reduction circuit includes a feedback path from said plurality of registers to said pulse generator.

7. The baseband circuit of claim 6 wherein said feedback path includes a threshold comparator, in said AMPR reduction circuit, configured to compare the magnitude of the sample in said sequence of samples that has been previously analyzed to said low-magnitude threshold.

8. The baseband circuit of claim 6 wherein said feedback path includes an insertion vector generator configured to generate an insertion vector for scaling the AMPR-reducing pulse generated by said pulse generator.

9. The baseband circuit of claim 8 wherein said insertion vector generator is configured to generate a complex insertion vector and said pulse generator is configured to generate a complex pulse that alters both the magnitude and phase of said at least said previously analyzed sample in said sequence of samples.

10. A method of reducing the average-to-minimum power ratio (AMPR) in a communications signal, comprising:
    determining whether the magnitude of a first sample in a sequence of samples of a communications signal is less than a low-magnitude threshold;
    if the magnitude of said first sample is determined to be less than said low magnitude threshold, modifying said first sample and a second sample in the sequence of samples that follows said first sample;
    determining whether the magnitude of the previously modified second sample is less than said low-magnitude threshold; and
    if the magnitude of said previously modified second sample is determined to be less than said low-magnitude threshold, further modifying said previously modified second sample.

11. The method of claim 10 wherein modifying said first sample comprises increasing the magnitude of said first sample to or above said low-magnitude threshold, modifying said second sample comprises increasing the magnitude of said second sample, and further modifying said previously modified second sample comprises increasing the magnitude of said previously modified second sample to or above said low-magnitude threshold.

12. The method of claim 11 wherein further modifying said previously modified second sample comprises altering the phase of said previously modified second sample in a direction perpendicular to a signal trajectory between said first sample and said previously modified second sample.

13. The method of claim 10 wherein further modifying said previously modified second sample comprises:
    calculating an insertion vector having an insertion angle and insertion phase;
    generating an AMPR-reducing pulse having a magnitude and phase determined by the insertion angle and insertion phase of said insertion vector; and
    inserting said AMPR-reducing pulse in the temporal vicinity of said previously modified second sample to reduce the AMPR of said communications signal.

14. A communications transmitter, comprising:
    a baseband processor configured to generate a sequence samples of a baseband signal, each sample of said sequence of samples having an in-phase (I) coordinate and a quadrature (Q) phase coordinate, said baseband processor including an average-to-minimum power ratio (AMPR) reduction circuit configured to:
    determine if a sample in said sequence of samples that has been previously analyzed by said AMPR reduction circuit;
    determine it said previously analyzed sample has a magnitude less than a low-magnitude threshold;
    when said previously analyzed sample has a magnitude less than a low magnitude threshold, produce a modified sequence of samples by modifying the I and Q coordinates of at least said previously analyzed samples in said sequence of samples;
    an upconverter coupled to said baseband processor; and
    a power amplifier coupled to said upconverter.

15. The communications transmitter of claim 14 wherein when said previously analyzed sample has a magnitude less than a magnitude threshold said AMPR reduction circuit comprises a pulse generator configured to generate an AMPR-reducing pulse having I and Q coordinates that are combined with I and Q coordinates of at least said previously analyzed samples in said sequence of samples.

16. The communications transmitter of claim 15 wherein said pulse generator comprises I-channel and Q-channel tapped delay lines.

17. The communications transmitter of claim 15 wherein said AMPR reduction circuit includes a feedback path having a threshold comparator configured to compare the sample in said sequence of samples that has been previously analyzed by said AMPR reduction circuit to said low-magnitude threshold.

18. The communications transmitter of claim 17 wherein said feedback path further includes an insertion vector generator configured to generate an insertion vector for scaling the AMPR-reducing pulse generated by said pulse generator if said threshold comparator determines that the magnitude of the sample in said sequence of samples that has been previously analyzed by said AMPR reduction circuit is less than said low-magnitude threshold.

19. A polar transmitter, comprising:
a baseband processor configured to generate a sequence samples of a baseband signal, each sample of said sequence of samples having an in-phase (I) coordinate and a quadrature (Q) phase coordinate, said baseband processor including an average-to-minimum power ratio (AMPR) reduction circuit configured to:
determine if a sample in said sequence of sample that has been previously analyzed by said AMPR reduction circuit;
determine if said previously analyzed sample has a magnitude less than a low-magnitude threshold;
when said previously analyzed sample has a magnitude less than a low magnitude threshold, produce a modified sequence of samples by modifying the I and Q coordinates of at least said previously analyzed sample in said sequence of samples;
a rectangular-to-polar converter configured to convert said modified sequence of samples to polar-coordinate amplitude and angle component signals;
an amplitude modulator configured to generate an amplitude-modulated power supply signal from amplitude information in said polar-coordinate amplitude component signal;
an angle modulator configured to generate an angle-modulated signal from angle information in said polar-coordinate angle component signal; and
a power amplifier configured to generate an angle- and amplitude-modulated carrier signal from said amplitude-modulated power supply signal and said polar-coordinate angle-modulated signal.

20. The polar transmitter of claim 19 wherein when said previously analyzed sample has a magnitude less than a low magnitude threshold said AMPR reduction circuit comprises a pulse generator configured to generate an AMPR-reducing pulse having I and Q coordinates that are combined with I and Q coordinates of at least said previously analyzed samples in said sequence of samples.

21. The polar transmitter of claim 20 wherein said pulse generator comprises I-channel and Q-channel tapped delay lines.

22. The polar transmitter of claim 20 wherein said AMPR reduction circuit includes a feedback path having a threshold comparator configured to compare the sample in said sequence of samples that has been previously analyzed by said AMPR reduction circuit to said low-magnitude threshold.

23. The polar transmitter of claim 22 wherein said feedback path further includes an insertion vector generator configured to generate an insertion vector for scaling the AMPR-reducing pulse generated by said pulse generator if said threshold comparator determines that the magnitude of the sample in said sequence of samples that has been previously analyzed by said AMPR reduction circuit is less than said low-magnitude threshold.

* * * * *